United States Patent
Wang et al.

(10) Patent No.: US 6,770,975 B2
(45) Date of Patent: Aug. 3, 2004

(54) INTEGRATED CIRCUITS WITH MULTIPLE LOW DIELECTRIC-CONSTANT INTER-METAL DIELECTRICS

(75) Inventors: Shi-Qing Wang, Campbell, CA (US); Henry Chung, Cupertino, CA (US); James Lin, Taipei (TW)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/328,646

(22) Filed: Jun. 9, 1999

(65) Prior Publication Data

US 2002/0130416 A1 Sep. 19, 2002

(51) Int. Cl.$^7$ .......................... H01L 23/48; H01L 23/52; H01L 23/58
(52) U.S. Cl. ....................... 257/759; 257/642; 257/758; 257/760; 257/762
(58) Field of Search .............................. 257/635, 637, 257/642, 643, 751, 758, 759, 760, 762, 767, 773, 774; 438/82, 622, 623, 687, 725, 780

(56) References Cited

U.S. PATENT DOCUMENTS

| | | | |
|---|---|---|---|
| 5,625,232 A | * 4/1997 | Numata et al. | 257/758 |
| 5,693,566 A | 12/1997 | Cheung | 437/195 |
| 5,801,095 A | 9/1998 | Huang et al. | 438/624 |
| 5,858,869 A | 1/1999 | Chen et al. | 438/597 |
| 5,864,172 A | 1/1999 | Kapoor et al. | 257/634 |
| 6,059,553 A | * 5/2000 | Jin et al. | 421/387 |
| 6,071,809 A | * 6/2000 | Zhao | 438/634 |
| 6,080,526 A | 6/2000 | Yang et al. | 430/296 |
| 6,097,095 A | 8/2000 | Chung | 257/774 |
| 6,124,198 A | 9/2000 | Moslehi | 438/622 |
| 6,143,640 A | * 11/2000 | Cronin et al. | 438/618 |
| 6,143,641 A | 11/2000 | Kitch | 438/618 |
| 6,165,893 A | 12/2000 | Chung | 438/623 |
| 6,207,555 B1 | 3/2001 | Ross | 438/633 |
| 6,211,063 B1 | 4/2001 | Liu et al. | 438/624 |
| 6,265,780 B1 | * 7/2001 | Yew et al. | 257/759 |
| 6,278,174 B1 | * 8/2001 | Havemann et al. | 257/637 |

FOREIGN PATENT DOCUMENTS

| | | |
|---|---|---|
| EP | 0 680 085 A1 | 2/1995 |
| EP | 0 692 824 A2 | 1/1996 |
| EP | 0 805 491 A2 | 5/1997 |
| EP | 0 849 796 A2 | 6/1998 |

OTHER PUBLICATIONS

XP 000300654, "Multilevel Interconnection Structure", IBM Technical Disclosure Bulletin, vol. 34, No. 9, Feb. 1992, p. 220.

(List continued on next page.)

*Primary Examiner*—Hung Vu
(74) *Attorney, Agent, or Firm*—Roberts & Roberts

(57) ABSTRACT

The invention provides processes for the formation of structures in microelectronic devices such as integrated circuit devices. More particularly, the invention relates to the formation of vias, interconnect metallization and wiring lines using multiple low dielectric-constant inter-metal dielectrics. The processes use two or more dissimilar low-k dielectrics for the inter-metal dielectrics of Cu-based dual damascene backends of integrated circuits. The use of both organic and inorganic low-k dielectrics offers advantages due to the significantly different plasma etch characteristics of the two kinds of dielectrics. One dielectric serves as the etchstop in etching the other dielectric so that no additional etchstop layer is required. Exceptional performance is achieved due to the lower parasitic capacitance resulting from the use of low-k dielectrics. An integrated circuit structure is formed having a substrate; an inorganic layer on the substrate which is composed of a pattern of metal lines on the substrate and an inorganic dielectric on the substrate between the metal lines; and an organic layer on the inorganic layer which is composed of an organic dielectric having metal filled vias therethrough which connect to the metal lines of the inorganic layer.

9 Claims, 32 Drawing Sheets

Multi-Level Interconnection Architecture II

OTHER PUBLICATIONS

XP 000583029, "Low Dielectric Constant Materials for Interlayer Dielectric Applications,"Shyam P. Murarka, Solid State Technology, Mar. 1996, No. 3, Tulsa, OK, US, pp 3–7.

XP–000952344, "Processing and Characterization of Silica Xerogel Films for Low–K Dielectric Applications," Anarag Jain, et al., Mat. Res. Soc. Symp. Proc. vol. 565, 1999, Materials Research Society, pp 8–19.

"High Stud–To–Line Contact Area in Damascene Metal Processing"; IBM Technical Disclosure Bulletin, vol. 33, No. IA, Jun. 1990, pp 160–161.

"High Stud–To–Line Contact Area in Damascene Metal Processing"; IBM Technical Disclosure Bulletin, vol. 33, No. IA, Jun. 1990, pp 160–161.

* cited by examiner

Figure 1 Multi-Level Interconnection Architecture I

Figure 2 Multi-Level Interconnection Architecture II

Step 1 Organic low-k dielectric deposition
Step 2 Inorganic low-k dielectric deposition
Step 3 Resist spin and bake Step 4  Via mask and resist development
Step 5  Metal trench inorganic low-k dielectric etch Step 6 Via organic low-k dielectric etch Step 7 Resist spin and bake Step 8 Metal trench mask and resist development Step 9 Inorganic low-k dielectric etch Step 10 Selective removal of resist Step 11  Cu interconnect processing Step 1 Organic low-k dielectric deposition
Step 2 Inorganic low-k dielectric deposition
Step 3 Resist spin and bake Step 4  Via mask and resist development
Step 5  Inorganic low-k dielectric etch Step 6 Resist removal Step 7   Organic low-k dielectric deposition
Step 8   Inorganic low-k dielectric deposition
Step 9   Resist spin and bake
Step 10  Metal trench mask and resist development Step 11 Inorganic low-k dielectric etch Step 12  Organic low-k dielectric etch Step 13  Organic low-k dielectric etch Step 14  Cu interconnect processing Step 1 Organic low-k dielectric deposition
Step 2 Inorganic low-k dielectric deposition
Step 3 Organic low-k dielectric deposition
Step 4 Inorganic low-k dielectric deposition
Step 5 Resist spin and bake Step 6 Via mask and resist development
Step 7 Inorganic low-k dielectric etch Step 8  Organic low-k dielectric etch
Step 9  Inorganic low-k dielectric etch

Step 10 Selective resist removal

Step 11 Resist spin and bake

Step 12 Metal trench mask and resist development

Step 13 Inorganic low-k dielectric etch

Step 14 Organic low-k dielectric etch

Step 15 Via inorganic low-k dielectric etch

Step 10 Organic low-k dielectric etch

Step 11 Resist spin and bake

Step 12 Metal trench mask and resist development

Step 13 Inorganic low-k dielectric etch

Step 14  Organic low-k dielectric and resist etch

INTEGRATED CIRCUITS WITH MULTIPLE LOW DIELECTRIC-CONSTANT INTER-METAL DIELECTRICS

BACKGROUND OF THE INVENTION

1. Field of the Invention

The present invention relates to the formation of structures in microelectronic devices such as integrated circuit devices. More particularly, the invention relates to the formation of vias, interconnect metallization and wiring lines using multiple low dielectric constant intermetal dielectrics.

2. Description of the Related Art

In the production of microelectronic devices, integrated circuits utilize multilevel wiring structures for interconnecting regions within devices and for interconnecting one or more devices within the integrated circuits. In forming such structures, it is conventional to form a first lower level wiring lines, then an interlevel dielectric layer and then to form second level wiring lines. One or more metal filled vias are typically formed in the interlevel dielectric to connect the first and second level wiring lines.

One conventional method for forming a two level wiring structure is to first form a two level interconnect structure over a substrate. The surface of a substrate may be the surface of a silicon device structure or the surface of substrate may be an insulating layer. An oxide layer is typically deposited over the substrate by chemical vapor deposition. The first level interconnect structures are defined by a conventional photolithography process which forms openings through the oxide layer where the first level interconnects will be formed. Generally, the openings expose portions of conductors in the substrate to which interconnects are formed. The openings are filled with a metal interconnect to form the interconnect and form a metal plug. Then a layer of metal such as aluminum is deposited over the surface of the oxide layer and over the metal plug to a thickness appropriate for second level wiring lines. The metal layer is then patterned into the second level wiring lines. The second level wiring lines are defined in a conventional photolithography process by providing a layer of photoresist over the metal layer, exposing the photoresist through a mask and removing portions of the exposed photoresist layer to form a photoresist etch mask. The portions of the metal layer exposed by openings in the photoresist mask are then removed by etching and the photoresist mask is removed by ashing. After the two level interconnect structure is formed, it is necessary to provide an intermetal dielectric (IMD) layer between the second level wiring lines and covering the second level wiring lines to accommodate further processing of the integrated circuit device. In the past, the intermetal dielectric layer might consist of one or more layers of oxide deposited by plasma enhanced chemical vapor deposition or other processes.

Prior art integrated circuits produced by single or dual damascene processes with Cu interconnects and low dielectric-constant (k) intermetal dielectrics have used only one kind of low-k dielectric, either inorganic, organic or a hybrid of these two kinds. This conventional approach of using the same kind of low-k dielectric for both metal-level and via-level IMD's has limited process integration and implementation options. As a result, additional processing steps and added cost are required. It is desirable whenever possible to reduce the number of processing steps required to form a device because reducing the number of processing steps shortens the time required to produce the device and because eliminating processing steps improves yields and so reduces costs.

The present invention uses two or more dissimilar low-k dielectrics for the intermetal dielectrics of Cu-based dual damascene backends of integrated circuits. The use of both organic and inorganic low-k dielectrics offers several advantages due to the significantly different plasma etch characteristics of these two kinds of dielectrics. One dielectric serves as an etchstop in etching the other dielectric. No additional oxide or nitride etchstop layer is required. High performance is achieved due to the lower parasitic capacitance resulting from the use of low-k dielectrics.

SUMMARY OF THE INVENTION

The invention provides an integrated circuit structure which comprises a substrate and (a) an inorganic layer on the substrate which comprises a pattern of metal lines on the substrate and an inorganic dielectric on the substrate between the metal lines; and (b) an organic layer on the inorganic layer which comprises an organic dielectric having metal filled vias therethrough which connect to the metal lines of the inorganic layer. Preferably the integrated circuit structure comprises (c) an additional inorganic layer on the organic layer which comprises a pattern of additional metal lines on the organic layer and an inorganic dielectric on the organic layer between the additional metal lines; and (d) an additional organic layer on the additional inorganic layer which comprises an organic dielectric having metal filled vias therethrough which connect to the additional metal lines of the additional inorganic layer.

The invention also provides an integrated circuit structure which comprises a substrate and (a) an organic layer on the substrate which comprises a pattern of metal lines on the substrate and an organic dielectric on the substrate between the metal lines; and (b) an inorganic layer on the organic layer which comprises an inorganic dielectric having metal filled vias therethrough which connect to the metal lines of the organic layer. Preferably the integrated circuit structure comprises (c) an additional organic layer on the inorganic layer which comprises a pattern of additional metal lines on the inorganic layer and an organic dielectric on the inorganic layer between the additional metal lines; and (d) an additional inorganic layer on the additional organic layer which comprises an inorganic dielectric having metal filled vias therethrough which connect to the additional metal lines of the additional organic layer.

The invention also provides a dielectric coated substrate which comprises:

(a) a first dielectric composition film on a substrate; and (b) a second dielectric composition film on the first dielectric composition film;

wherein the first dielectric composition and the second dielectric composition have substantially different etch resistance.

The invention further provides a process for producing an integrated circuit structure which comprises (a) providing a substrate which comprises a pattern of metal lines on the substrate and a dielectric on the substrate between the metal lines;

(b) depositing an organic dielectric layer on the substrate;

(c) depositing an inorganic dielectric layer on the organic dielectric;

(d) etching a pattern of vias through the inorganic dielectric layer;

(e) etching a pattern of vias through the organic dielectric layer which correspond to the pattern of vias through the inorganic dielectric layer;

(f) applying a photoresist to the top of the inorganic dielectric layer and filling the vias in the organic dielectric layer and the inorganic dielectric layer with photoresist;

(g) imagewise removing a portion of the photoresist from the top of the inorganic dielectric layer; and removing a portion and leaving a portion of the photoresist through a thickness of the inorganic dielectric layer;

(h) removing part of the inorganic dielectric layer underlying the portions of the photoresist removed from the top of the inorganic dielectric layer to form trenches in the inorganic dielectric layer;

(i) removing the balance of the photoresist from the top of the inorganic dielectric layer and from the vias;

(j) filling the vias in the organic dielectric and the trenches in the inorganic dielectric with a metal.

The invention still further provides a process for producing an integrated circuit structure which comprises (a) providing a substrate, which comprises a pattern of metal lines on the substrate and a dielectric on the substrate between the metal lines;

(b) depositing an organic via level dielectric on the substrate;

(c) depositing an thin inorganic dielectric layer on the organic via level dielectric;

(d) imagewise patterning and removing a portion of the thin inorganic dielectric layer thus defining vias through the thin inorganic dielectric layer;

(e) depositing a thin organic dielectric etchstop material layer on the thin inorganic dielectric layer and filling the vias in the thin inorganic dielectric layer with the organic dielectric material;

(f) depositing a metal level inorganic dielectric layer on the organic dielectric etchstop layer;

(g) imagewise patterning and removing a portion of the metal level inorganic dielectric layer down to the organic dielectric etchstop material layer to form trenches in the metal level inorganic dielectric layer;

(h) removing the portion of the organic dielectric etchstop material layer underlying the corresponding removed portion of the metal level inorganic dielectric to form trenches therein, and removing the organic etchstop material from the vias in the thin inorganic dielectric layer;

(i) removing the portion of the organic via level dielectric layer underlying the thin inorganic dielectric layer thus forming vias through the organic via level dielectric layer down to the metal lines;

(j) filling the vias in the via level organic dielectric layer and the thin inorganic dielectric layer, and trenches in the organic dielectric etchstop layer and metal level inorganic dielectric layer with a metal.

The invention also provides a process for producing an integrated circuit structure which comprises (a) providing a substrate, which comprises a pattern of metal lines on the substrate and a dielectric on the substrate between the metal lines;

(b) depositing an organic via level dielectric layer on the substrate;

(c) depositing an thin inorganic dielectric layer on the organic via level dielectric;

(d) depositing a thin organic dielectric etchstop material layer on the thin inorganic dielectric layer;

(e) depositing a metal level inorganic dielectric layer on the organic dielectric etchstop layer;

(f) imagewise patterning and removing a portion of the metal level inorganic dielectric layer down to the organic dielectric etchstop material layer to form vias in the metal level inorganic dielectric layer;

(g) removing the portion of the organic dielectric etchstop material layer underlying the corresponding removed portions of the metal level inorganic dielectric layer to form vias in the organic dielectric etchstop material layer;

(h) removing the portion of the thin inorganic dielectric layer underlying the corresponding removed portions of the organic dielectric etchstop material layer to form vias in the thin inorganic dielectric layer;

(i) covering the top of the metal level inorganic dielectric layer with a photoresist and filling the vias in the metal level inorganic dielectric layer, the organic dielectric etchstop material layer and the thin inorganic dielectric layer with photoresist;

(j) imagewise patterning and removing a portion of the photoresist from the top of the metal level inorganic dielectric layer; and removing a portion and leaving a portion of the photoresist through a thickness of the metal level inorganic dielectric layer;

(k) removing part of the metal level inorganic dielectric layer underlying the portions of the photoresist removed from the top of the inorganic dielectric layer to form trenches in the metal level inorganic dielectric layer;

(l) removing the balance of the photoresist from the top of the metal level inorganic dielectric layer and from the vias; and removing the portion of the organic dielectric etchstop material layer underlying the trenches until the thin inorganic dielectric layer is reached;

(m) removing the portion of the organic via level dielectric layer underlying the vias in the thin inorganic dielectric layer;

(n) filling the vias in the via level organic dielectric layer and the thin inorganic dielectric layer, and trenches in the organic dielectric etchstop layer and metal level inorganic dielectric layer with a metal.

The invention furthermore provides a process for producing an integrated circuit structure which comprises (a) providing a substrate, which comprises a pattern of metal lines on the substrate and a dielectric on the substrate between the metal lines;

(b) depositing an organic via level dielectric layer on the substrate;

(c) depositing an thin inorganic dielectric layer on the organic via level dielectric (d) depositing a thin organic dielectric etchstop material layer on the thin inorganic dielectric layer;

(e) depositing a metal level inorganic dielectric layer on the organic dielectric etchstop layer;

(f) imagewise patterning and removing a portion of the metal level inorganic dielectric layer down to the organic dielectric etchstop material layer to form vias in the metal level inorganic dielectric layer;

(g) removing the portion of the organic dielectric etchstop material layer underlying the corresponding removed portions of the metal level inorganic dielectric layer to form vias in the organic dielectric etchstop material layer;

(h) removing the portion of the thin inorganic dielectric layer underlying the corresponding removed portions of the organic dielectric etchstop material layer to form vias in the thin inorganic dielectric layer;

(i) removing the portion of the organic via level dielectric layer underlying the corresponding removed portions of the thin inorganic dielectric layer to form vias in the organic via level dielectric layer;

(j) covering the top of the metal level inorganic dielectric layer with a photoresist and filling the vias in the metal level inorganic dielectric layer, the organic dielectric etchstop material layer, the thin inorganic dielectric layer and the organic via level dielectric layer with photoresist;

(k) imagewise patterning and removing a portion of the photoresist from the top of the inorganic dielectric layer; and removing a portion and leaving a portion of the photoresist through a thickness of the metal level inorganic dielectric layer;

(l) removing part of the metal level inorganic dielectric layer underlying the portions of the photoresist removed from the top of the inorganic dielectric layer to form trenches in the metal level inorganic dielectric layer;

(m) removing the balance of the photoresist from the top of the metal level inorganic dielectric layer and from the vias; and removing the portion of the organic dielectric etchstop material layer underlying the trenches until the thin inorganic dielectric layer is reached;

(n) filling the vias in the via level organic dielectric layer and the thin inorganic dielectric layer, and trenches in the organic dielectric etchstop layer and metal level inorganic dielectric layer with a metal.

DETAILED DESCRIPTION OF THE PREFERRED EMBODIMENT

Figure 1:
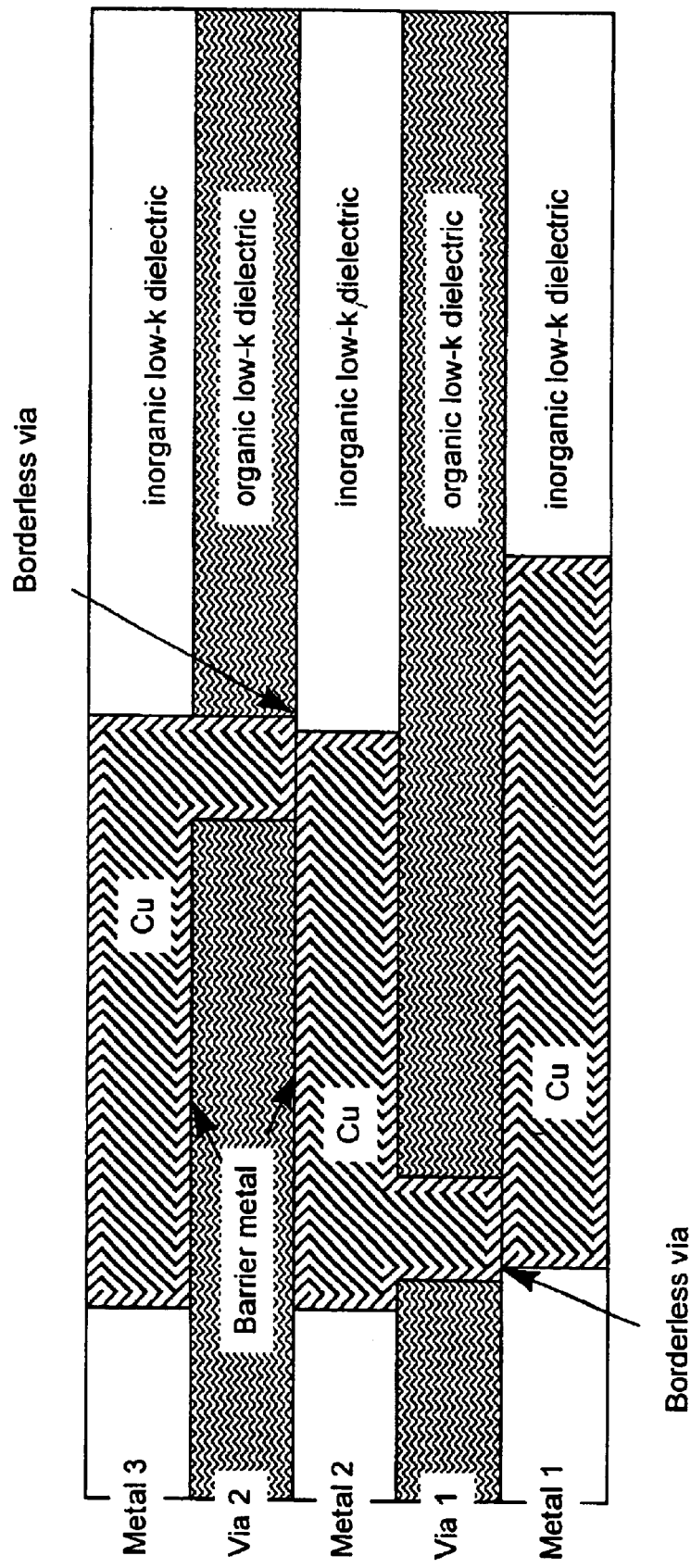
FIG. 1 shows a first integrated circuit architecture of multi-level interconnections fabricated according to this invention.

The integrated circuit architecture produced by a first process embodiment of the invention is show in FIG. 1. This structure uses two different kinds of low-k dielectric thin films for the IMD, one dielectric is organic and the other dielectric is inorganic. Shown in FIG. 1, architecture I, is the part of the backend of an integrated circuit of multi-level interconnections fabricated according to this invention. An organic low-k dielectric is used for via-level IMD and an inorganic low-k dielectric is used for metal-level IMD. The architecture II, structure is produced according to another embodiment of the invention. Architecture II differs from architecture I in that two thin layers of low-k dielectrics, the top one organic and the bottom inorganic, are added in between via-level and metal-level IMD's. The process steps used for the fabrication of via 1 and metal 2 can be repeated again for the upper levels of vias and metals. In the many embodiments of the invention, alternating dielectric layers have is a significant difference in etch rate. The invention takes advantage of a significant difference in plasma etch rate between organic and inorganic dielectrics. This is not available when the same dielectric is employed for both via-level and metal-level IMD's. In oxygen-based plasmas, organic dielectrics etch tremendously faster than inorganic dielectrics. Inversely, in carbon fluoride based plasmas, inorganic dielectrics etch much faster than organic dielectrics.

Figure 3:
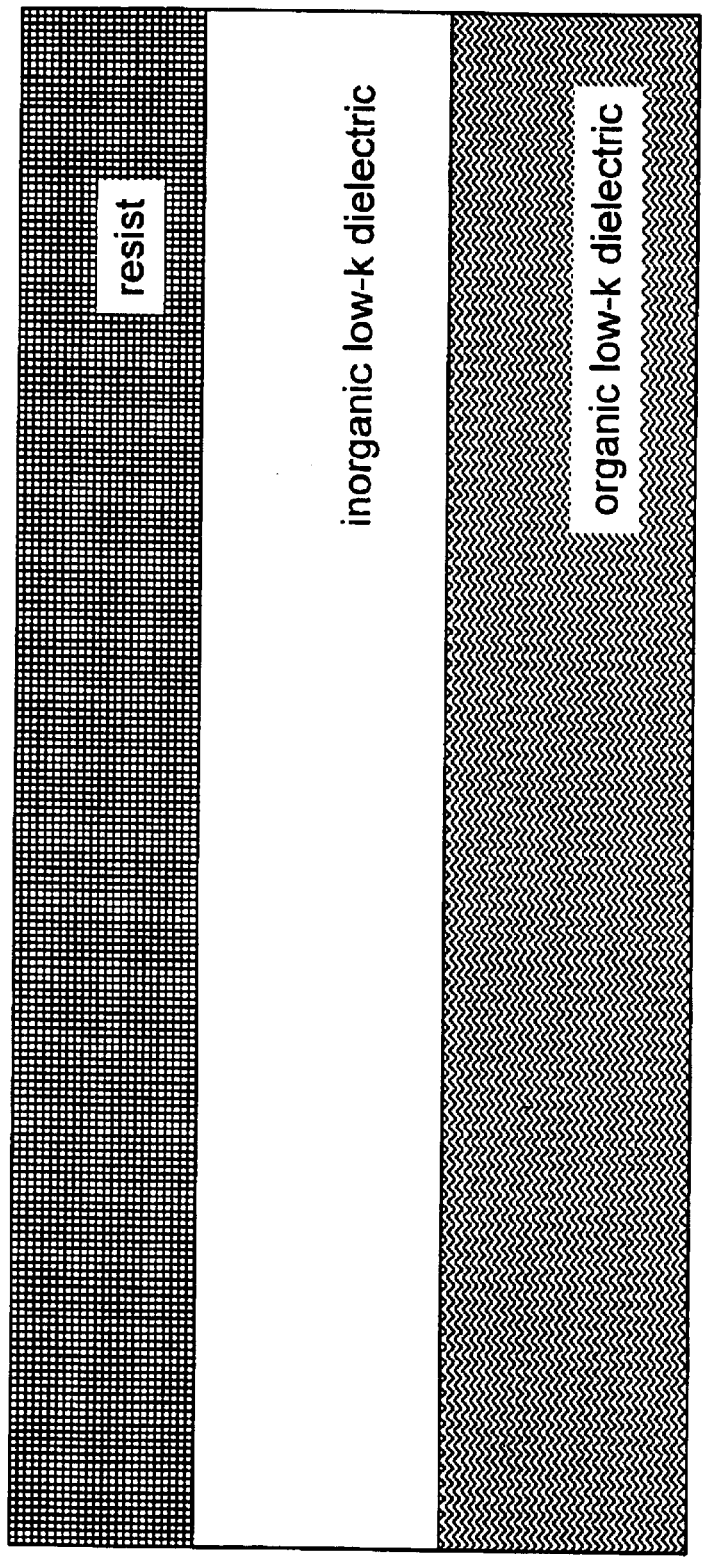
FIG. 3 shows the formation process for a first embodiment of the invention resulting after organic low-k dielectric deposition; inorganic low-k dielectric deposition and resist spin and bake.

A first process embodiment of the invention is exemplified by FIGS. 3 through 10. These figures show the process flow after the formation of the first-level interconnect or Metal 1, and the process flow from Via 1 level through the second-level of interconnect or Metal 2. However, the same processing steps can be repeated again for upper levels of vias and interconnects. FIG. 3 shows the interim structure after step 1 which is a deposition of an organic low-k dielectric, step which is a deposition of an in organic low-k dielectric and deposition and baking of a photoresist. The organic low-k dielectric is applied to a substrate having a pattern of metal lines on its surface. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof The lines are typically formed by well known lithographic techniques. Suitable materials for the lines include aluminum, aluminum alloys, copper, copper alloys, titanium, tantalum, and tungsten. These lines form the conductors of an integrated circuit. Such are typically closely separated from one another at distances preferably of from about 20 micrometers or less, more preferably from about 1 micrometer or less, and most preferably of from about 0.05 to about 1 micrometer.

The organic and inorganic dielectric compositions may comprise any of a wide variety of dielectric forming materials which are well known in the art for use in the formation of microelectronic devices. The dielectric layers may non-exclusively include silicon containing spin-on glasses, i.e. silicon containing polymer such as an alkoxysilane polymer, a silsesquioxane polymer, a siloxane polymer; a poly (arylene ether), a fluorinated poly(arylene ether), other polymeric dielectric materials, nanoporous silica or mixtures thereof. The only criteria for this invention is that organic dielectrics are formed adjacent to inorganic dielectrics. Useful organic dielectrics are those which follow which are carbon containing and inorganics are those which follow which are not carbon containing.

One useful polymeric dielectric material useful for the invention include an nanoporous silica alkoxysilane polymer formed from an alkoxysilane monomer which has the formula:

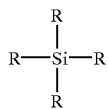

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$, and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly (arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Preferred siloxane materials suitable for use in this invention are commercially available from AlliedSignal Inc. under the tradename Accuglass® T-11, T-12 and T-14. Also useful are methylated siloxane polymers available from AlliedSignal Inc. under the tradenames Purespin™ and Accuspin® T18, T23 and T24.

Preferred silicon containing dielectric resins include polymers having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

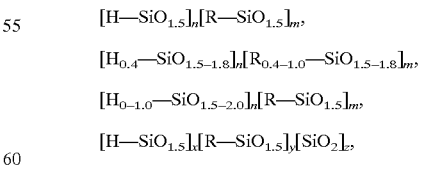

wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain high organic content silicon containing polymers such as those having the formula II:

$$[HSiO_{1.5}]_n[RSiO_{1.5}]_m,$$

$$[H_{0.4-1.0}SiO_{1.5-1.8}]_n[R_{0.4-1.0}SiO_{1.5-1.8}]_m,$$

$$[H_{0-1.0}SiO_{1.5-2.0}]_n[RSiO_{1.5}]_m,$$

wherein the sum of n and m is from about 8 to about 5000 and m is selected such that the carbon containing substituent is present in an amount of from about 40 Mole percent or greater; and $$[HSiO_{1.5}]_x[RSiO_{1.5}]_y[SiO_2]_z;$$

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cycloheptanone and cyclooctanone; cyclic amides such as N-alkylpyrrolidinone wherein the alkyl group has from 1 to about 4 carbon atoms, and N-cyclohexyl-pyrrolidinone, and mixtures thereof.

Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm³ to about 3 g/cm³.

The dielectric layer may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The polymer layer may also optionally be exposed to actinic light, such as UV light, to increase its molecular weight. The amount of exposure may range from about 100 mJ/cm² to about 300 mJ/cm². The dielectric layers may optionally be cured by overall exposed to electron beam radiation. Electron beam exposure may be controlled by setting the beam acceleration. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,001,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 µC/cm² and more preferably from about 50 to about 20,000 µC/cm². The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Figure 4:
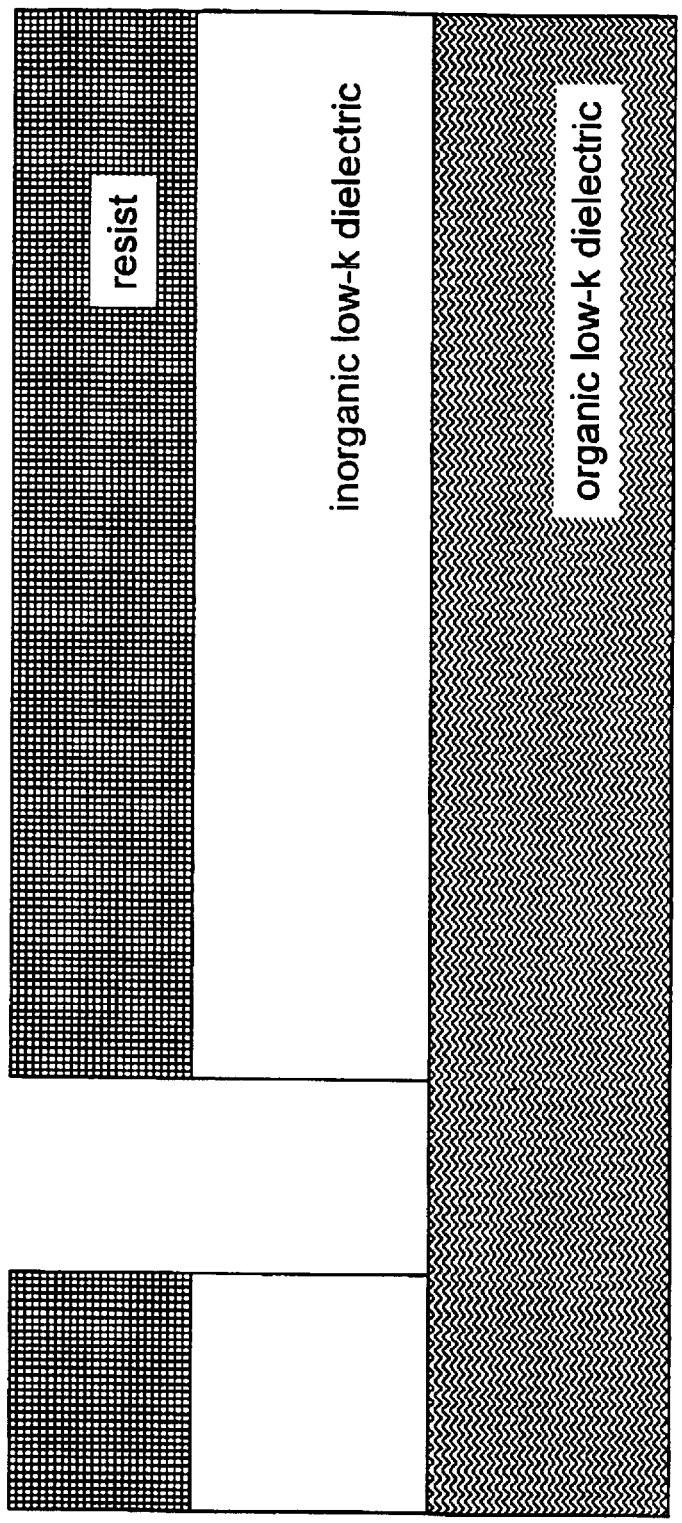
FIG. 4 shows the formation process resulting after via mask and resist development and metal trench inorganic low-k dielectric etch.

Vias are formed in the inorganic dielectric layer by well known photolithographic techniques using a photoresist composition. FIG. 4 shows the coated substrate after step 4, i.e. imagewise patterning and removal of portions of the resist and step 5, an inorganic dielectric etch to form cavities through these layers. Such are formed in a manner well known in the art such as by coating the photoresist, imagewise exposing to actinic radiation such as through a suitable mask, developing the photoresist and etching away portions of the inorganic dielectric to form cavities. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the inorganic dielectric surface by plasma etching. Plasma generators which are capable of such etching are described in U.S. Pat. Nos. 5,174,856 and 5,200,031.

Figure 5:
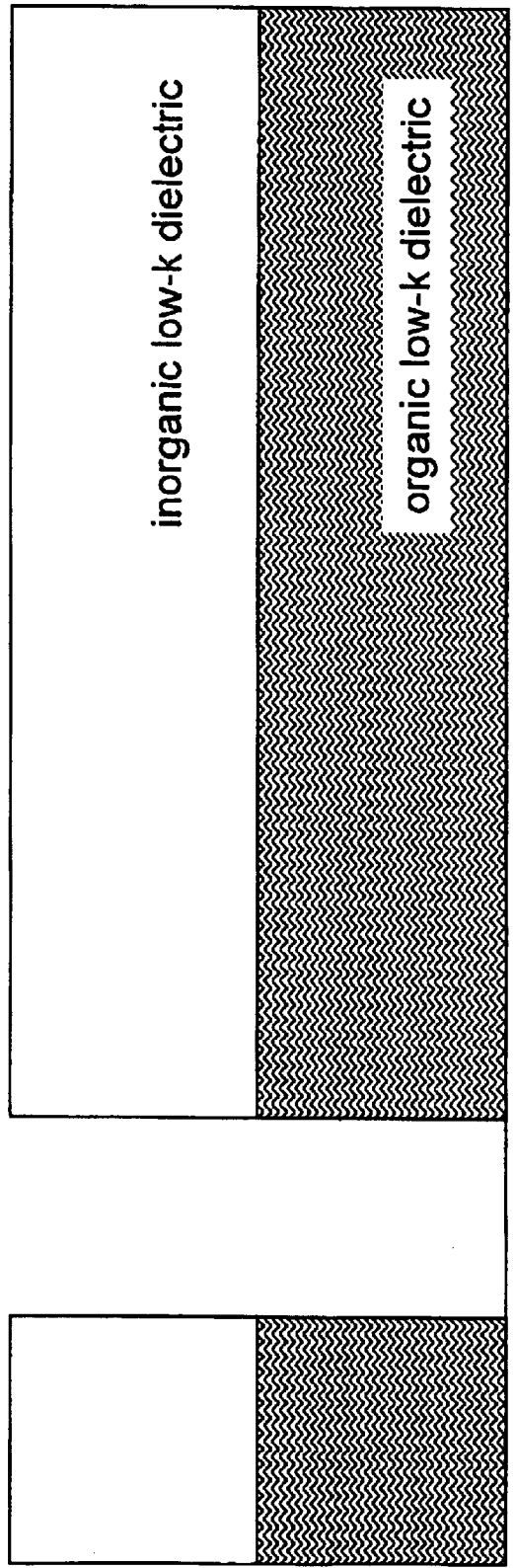
FIG. 5 shows the process result after via organic low-k dielectric etch.
Figure 6:
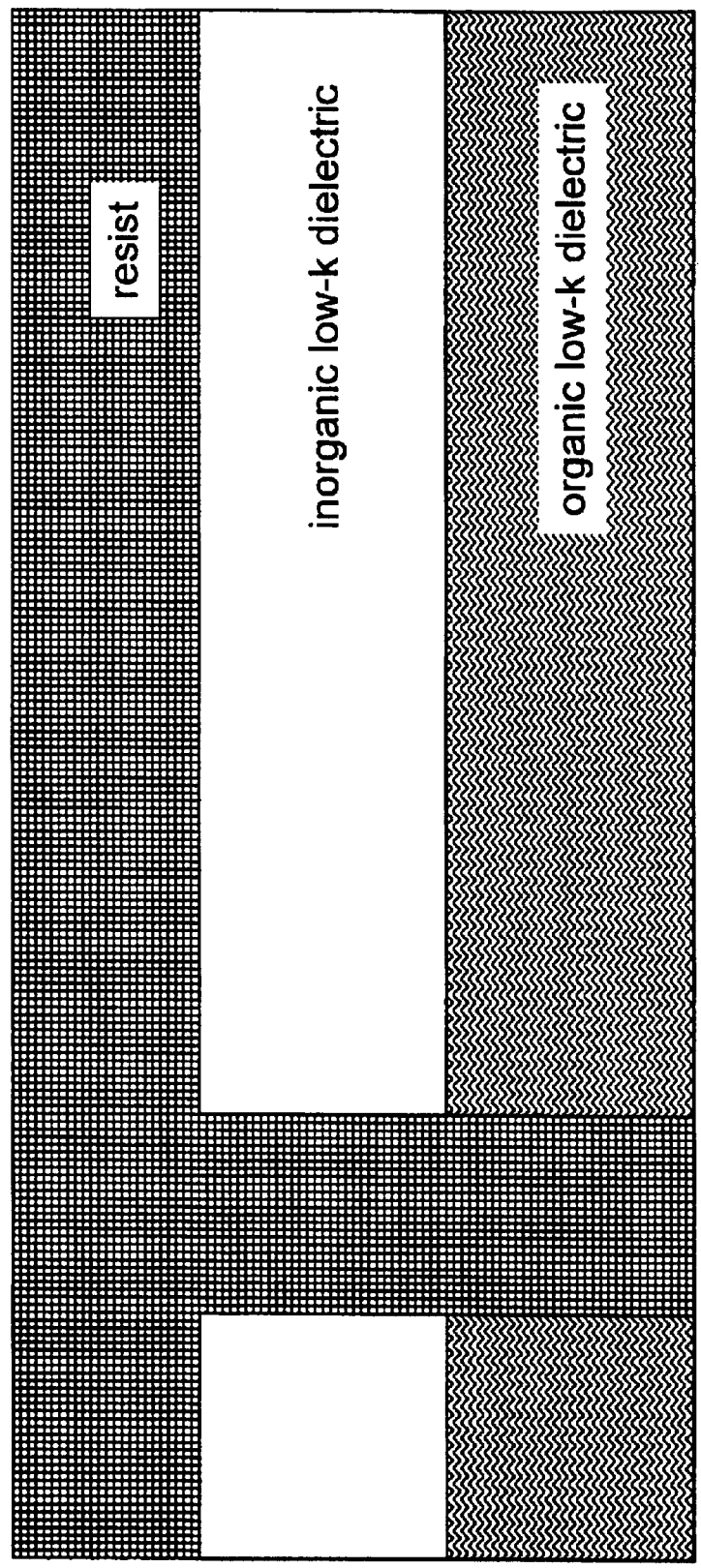
FIG. 6 shows the process result after resist spin and bake.
Figure 7:
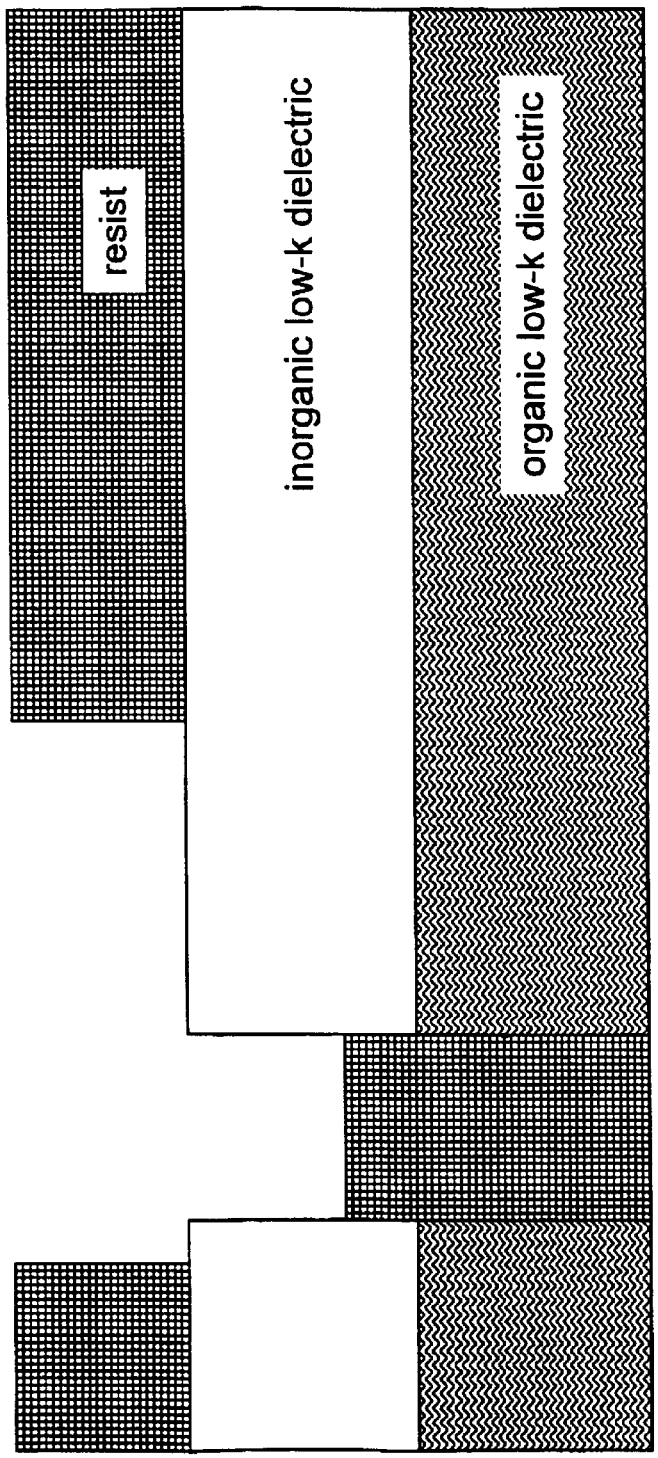
FIG. 7 shows the result after metal trench mask and resist development.

Next, in a sixth step, the organic low-k dielectric is etched by an etch chemistry which does not remove the inorganic low-k dielectric. The resulting structure with vias is shown in FIG. 5. Next, a resist application step 7 is required for metal trench patterning. Another photoresist is applied to the top of the inorganic dielectric layer and fills the vias in the organic dielectric layer and the inorganic dielectric layer with photoresist. FIG. 6 shows the structure after application and baking of the layer of resist material. In an eighth step, one imagewise exposes the resist through a metal trench mask, imagewise removes a portion of the photoresist from the top of the inorganic dielectric layer; and removes a portion and leaves a portion of the photoresist through a thickness of the inorganic dielectric layer. The result is seen in FIG. 7.

Figure 8:
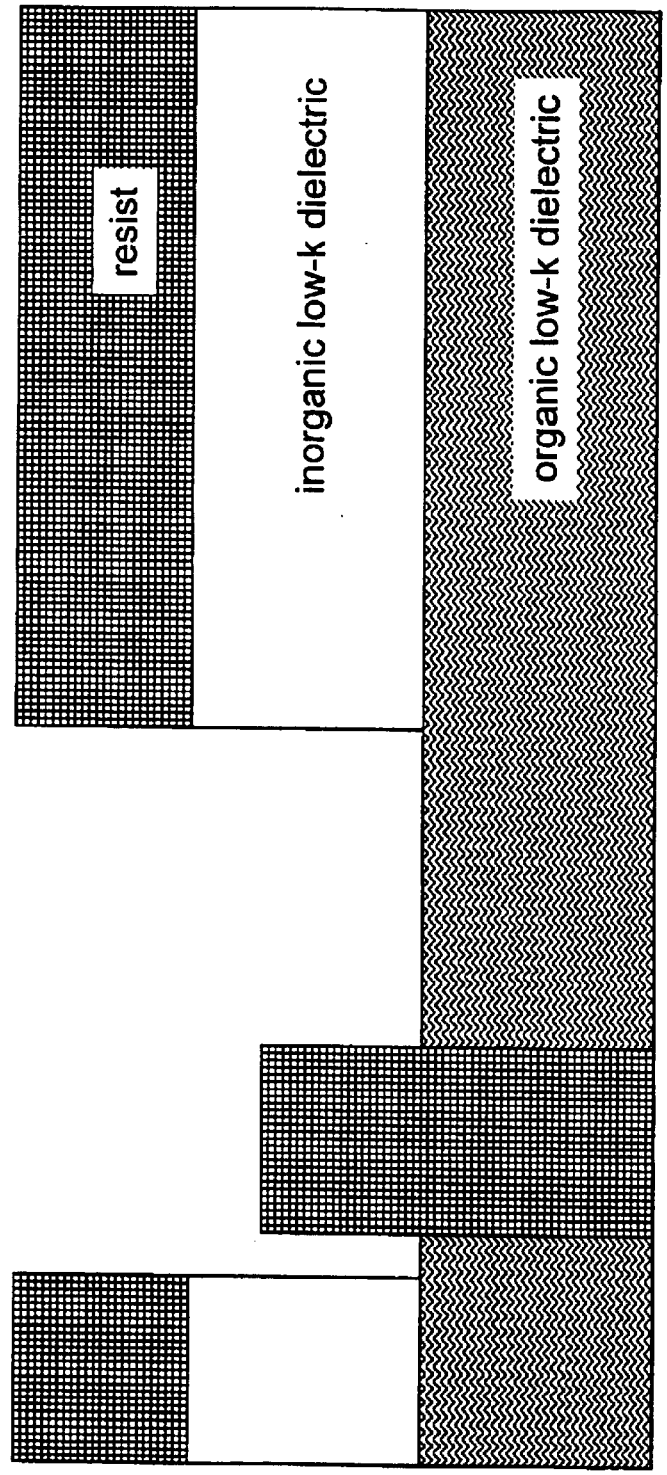
FIG. 8 shows the result after inorganic low-k dielectric etch.

A ninth step requires removing part of the inorganic dielectric layer underlying the portions of the photoresist removed from the top of the inorganic dielectric layer to form trenches in the inorganic dielectric layer. Due to chemical differences between the inorganic and organic dielectrics, the plasma etch rate of low-k organic dielectric can be made to be significantly less than the plasma etch rate of the inorganic dielectric. As a result, the etch stops once the inorganic dielectric on top of the organic dielectric is cleared. No etchstop is required in this approach. The result is seen in FIG. 8.

Figure 2:
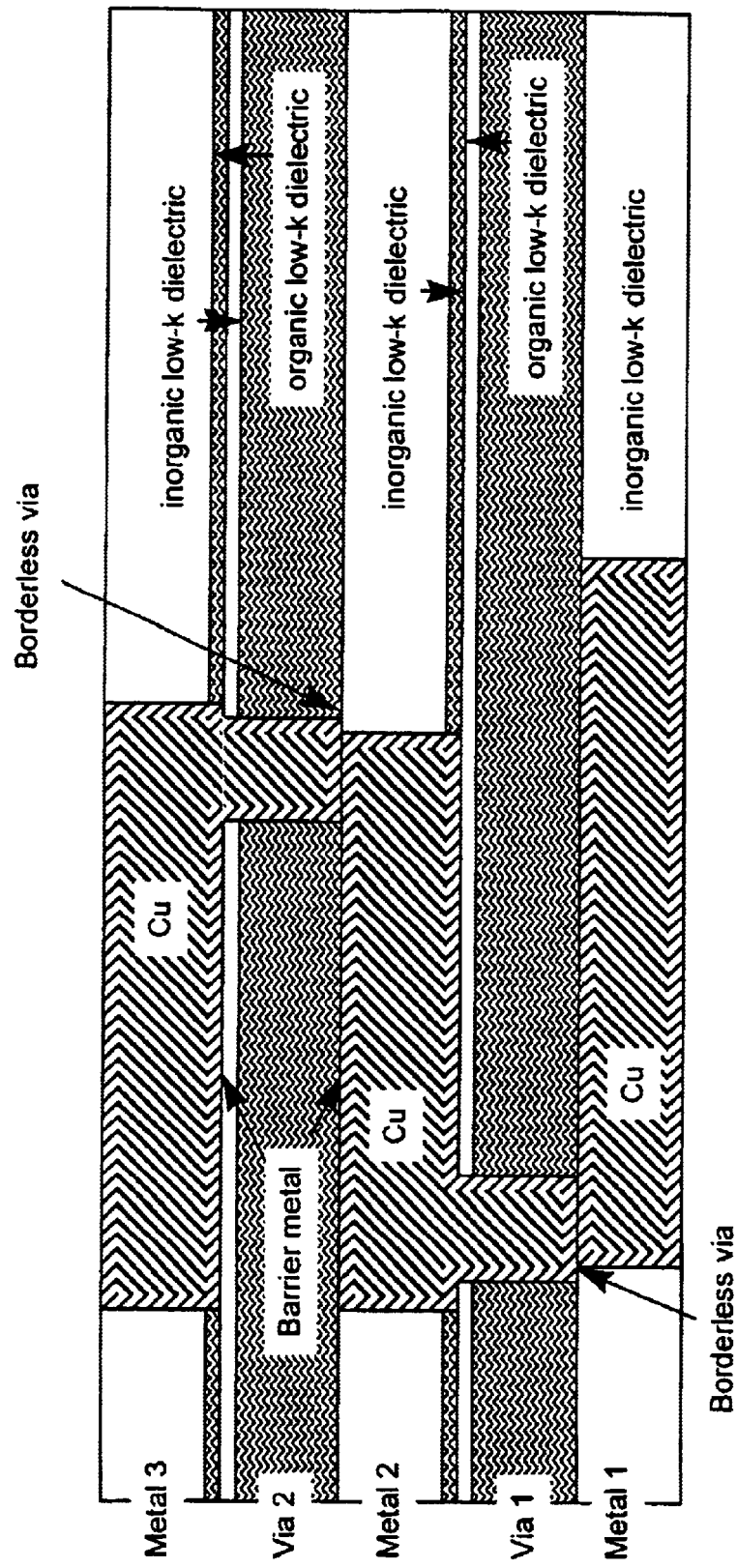
FIG. 2 shows a second integrated circuit architecture of multi-level interconnections fabricated according to this invention.
Figure 9:
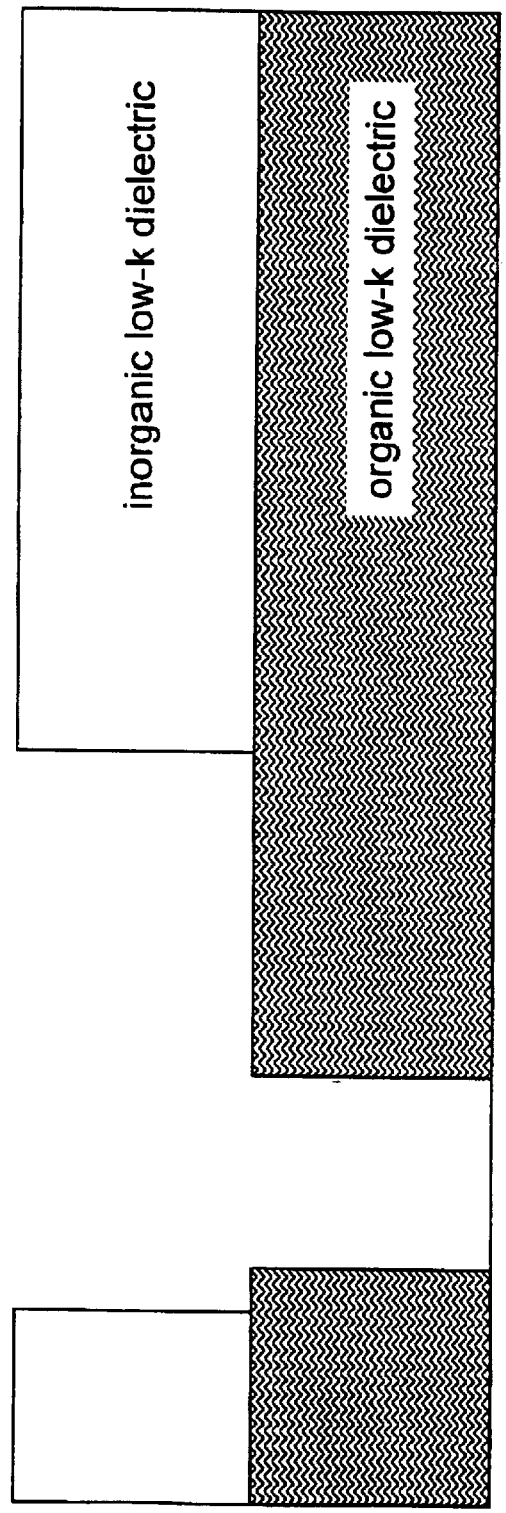
FIG. 9 shows the result after selective removal of resist.
Figure 10:
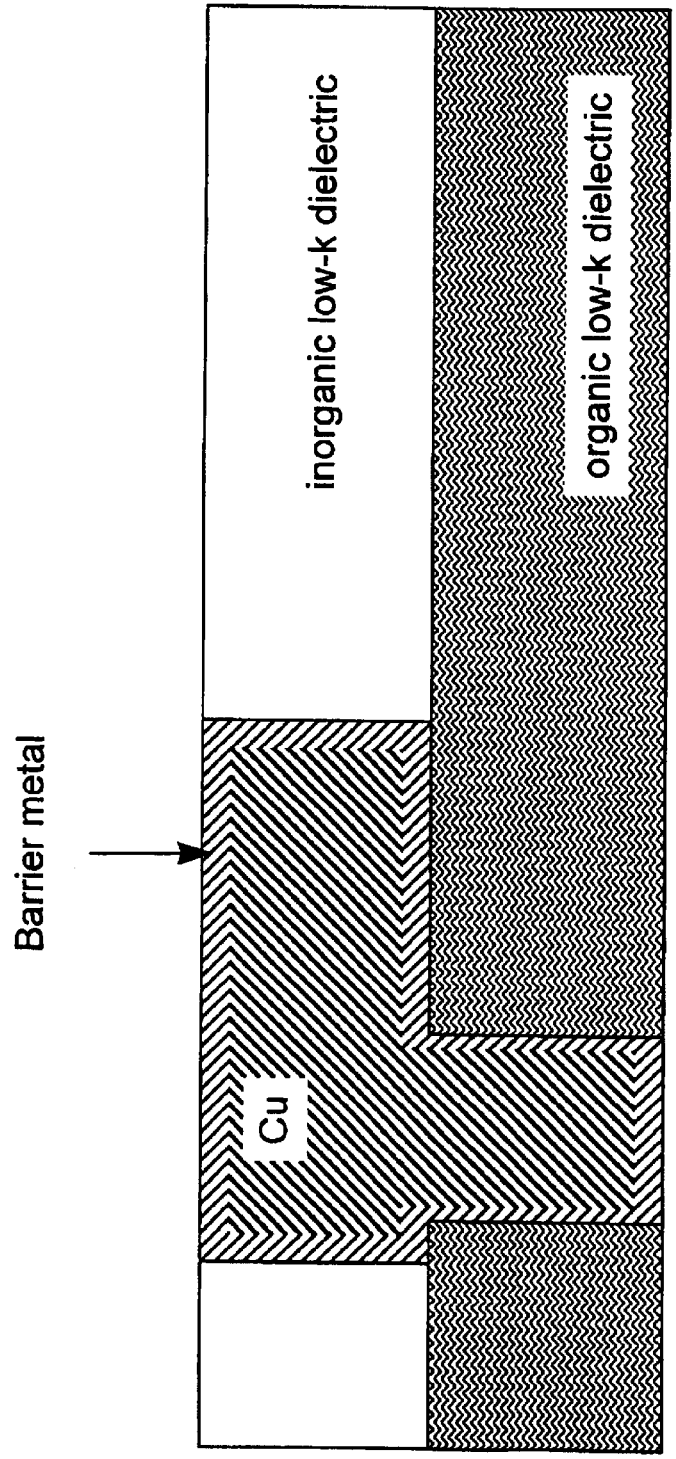
FIG. 10 shows the result after Cu interconnect processing.

The next step 10 removes the balance of the photoresist from the top of the inorganic dielectric layer and from the vias and the result is shown in FIG. 9. Step 11 fills the vias in the organic dielectric and the trenches in the inorganic dielectric with a metal as seen in FIG. 10. Suitable metals include aluminum, aluminum alloys, copper, copper alloys, tantalum, tungsten, titanium or other metals or mixtures thereof as typically employed in the formation of microelectronic devices. The metal may be applied by such techniques as vapor deposition, sputtering, evaporation and the like. Copper is most preferred. The thickness of the metal layers is preferably from about 3,000 to 15,000 Angstroms. Typically the metal is applied by first forming a barrier metal seeding layer on the walls of the vias and the top dielectric. Then the balance of the metal is applied. As used herein, the term "a metal" includes amalgams of metals. A barrier metal serves to prevent diffusion of the conductive metal into the dielectric layers. The barrier metal may be, for example, Ti or a nitride such TaN or TiN. Copper interconnect processing is used to form a self-aligned metal barrier on the top of the copper interconnect. With a metal barrier on top, the commonly used silicon nitride barrier is not necessary. It is to be understood that these steps may be repeated to provide a series of suitable layers and conductive paths over one another on the substrate to produce the architecture of FIG. 1. The architecture shown in FIG. 1 has several distinct features. A separation is not needed between two adjacent IMD's. When separation layers are required, low-k dielectric films can be used with the approach taken in this invention which utilizes two dissimilar low-k dielectric films for IMD's (FIG. 2). In a conventional approach, CVD oxide or silicon nitride is commonly used as separation layer. Both these prior inorganic dielectrics have the major disadvantage of having a high dielectric constant, 4 and 7, respectively, for silicon oxide and silicon nitride. Concerning the functions of the separation layers, heretofore a high dielectric constant material such as silicon nitride, is provided as an etchstop in opening metal trenches. In architecture I, there is no need to have such an etchstop since the organic low-k dielectric used for via-level IMD etches much slower than the inorganic low-k dielectric and thus it is an etchstop by itself.

Separation layers are also used as an etchstop in opening borderless vias when the vias are misaligned to the underlying metal line. The presence of the separation layers can prevent the creation of deep and narrow trenches, which are a major yield and reliability concern. However, a separation layer is not required for this invention for the reason that two dissimilar dielectrics are used and they are significantly different in their plasma etch characteristics. This embodiment has distinct advantages. Vias are not enlarged when a metal trench mask is misaligned in the direction away from the underlying via as shown in FIGS. 7–10. There is an issue of partially landed vias when a via is over-sized and/or misaligned to the underlying metal line as shown in FIG. 1. In the conventional approach, via over-sizing can be prevented by the addition of a separation layer between the adjacent IMD's. Such a separation layer is not required in this embodiment due to the fact that there is an extremely high plasma etch selectivity between inorganic and organic dielectrics in metal trench etching. Another advantage of this embodiment is its compatibility with borderless vias. There are two vias shown in FIG. 1. The bottom of these vias is not fully landed on the underlying Cu lines. This results from the use of borderless vias when they are misaligned in the direction away from metal lines. Prior efforts have been made to prevent the creation of deep and narrow trenches at the bottom of partially landed via. In the conventional approach, an etchstop layer, such as silicon nitride, is often added to prevent the formation of undesirable trenches. However, an etchstop is not necessary in this embodiment since there is a significantly high plasma etch selectivity between organic and inorganic dielectrics in opening vias.

When it is impractical to remove resist selectively in the presence of organic dielectrics, a different architecture, architecture II, is used. The following embodiments are to construct architecture II as shown in FIG. 2. Architecture II differs from architecture I in that the former has separation layers between metal-level and via-level IMD's.

Figure 11:
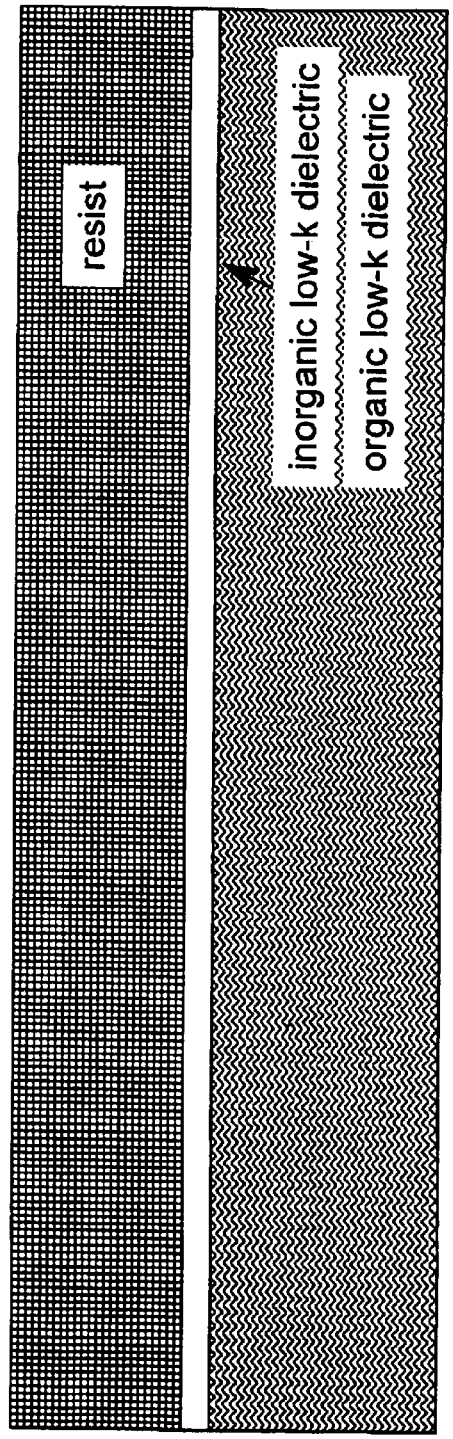
FIG. 11 shows the formation process for a second embodiment of the invention resulting after organic low-k dielectric deposition; inorganic low-k dielectric deposition and resist spin and bake.
Figure 12:
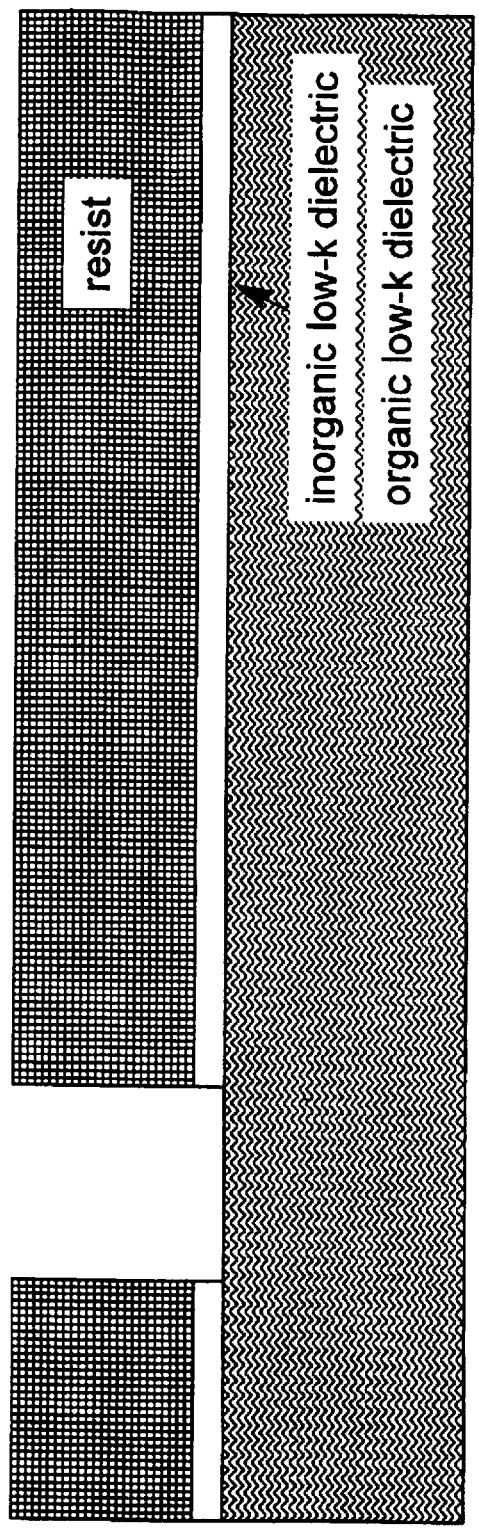
FIG. 12 shows the formation process for a second embodiment after via mask and resist development and inorganic low-k dielectric etch.
Figure 13:
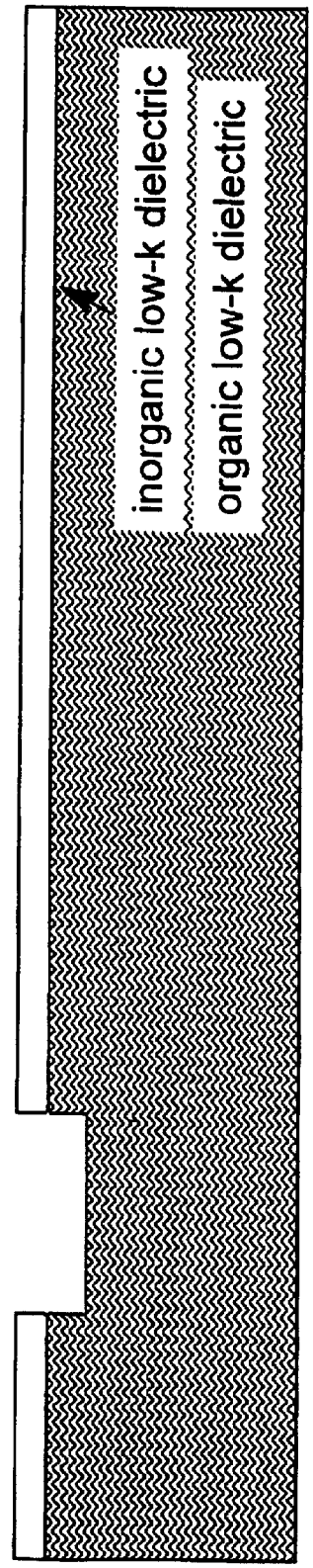
FIG. 13 shows the process after resist removal.
Figure 14:
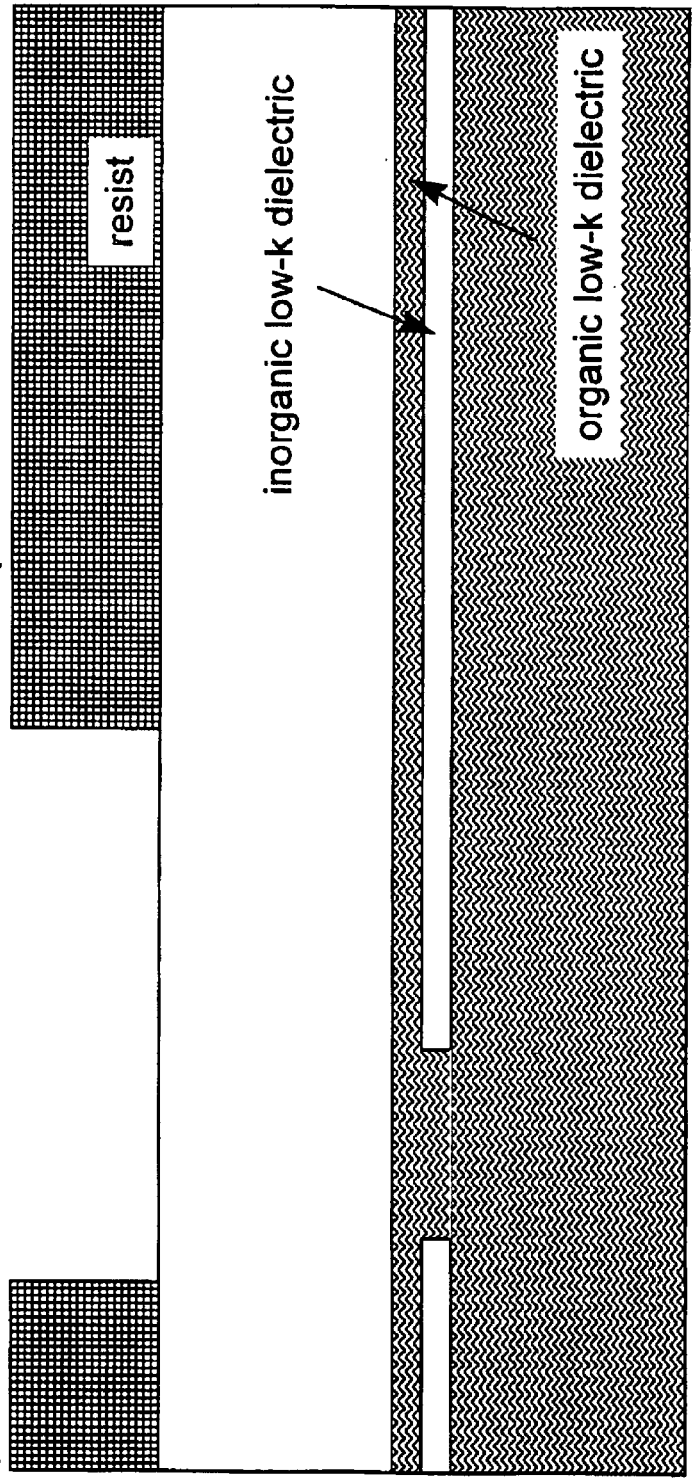
FIG. 14 shows the process after organic low-k dielectric deposition, inorganic low-k dielectric deposition, resist spin and bake and metal trench mask and resist development.
Figure 15:
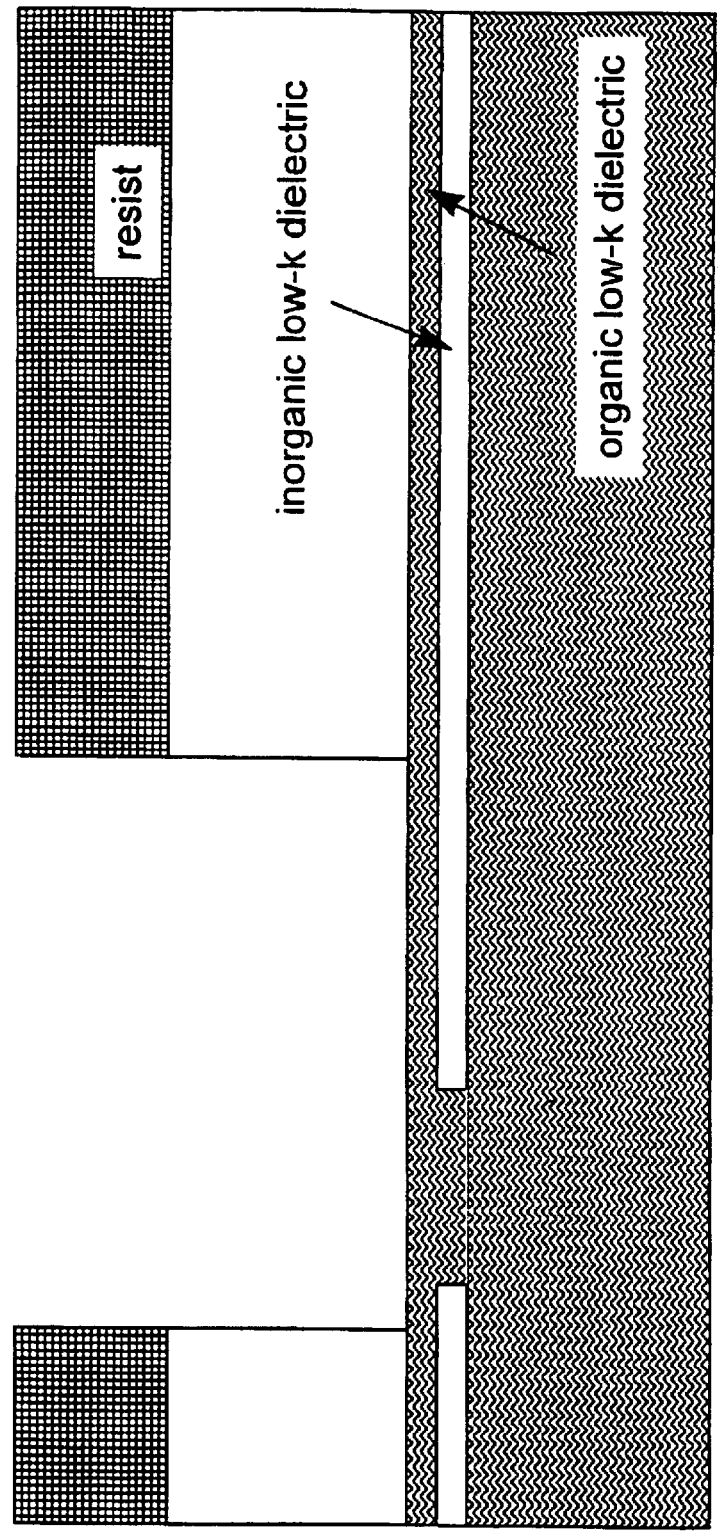
FIG. 15 shows the process after inorganic low-k dielectric etch.
Figure 16:
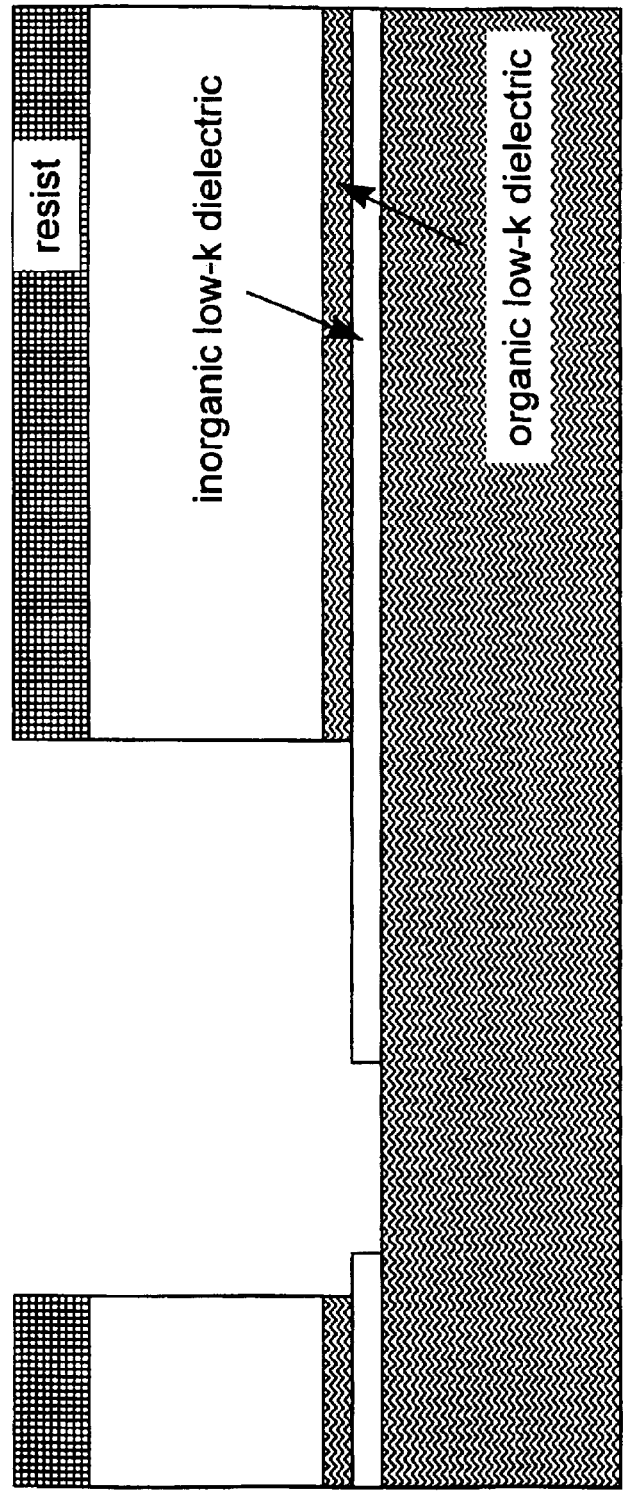
FIG. 16 shows the process after organic low-k dielectric etch.
Figure 17:
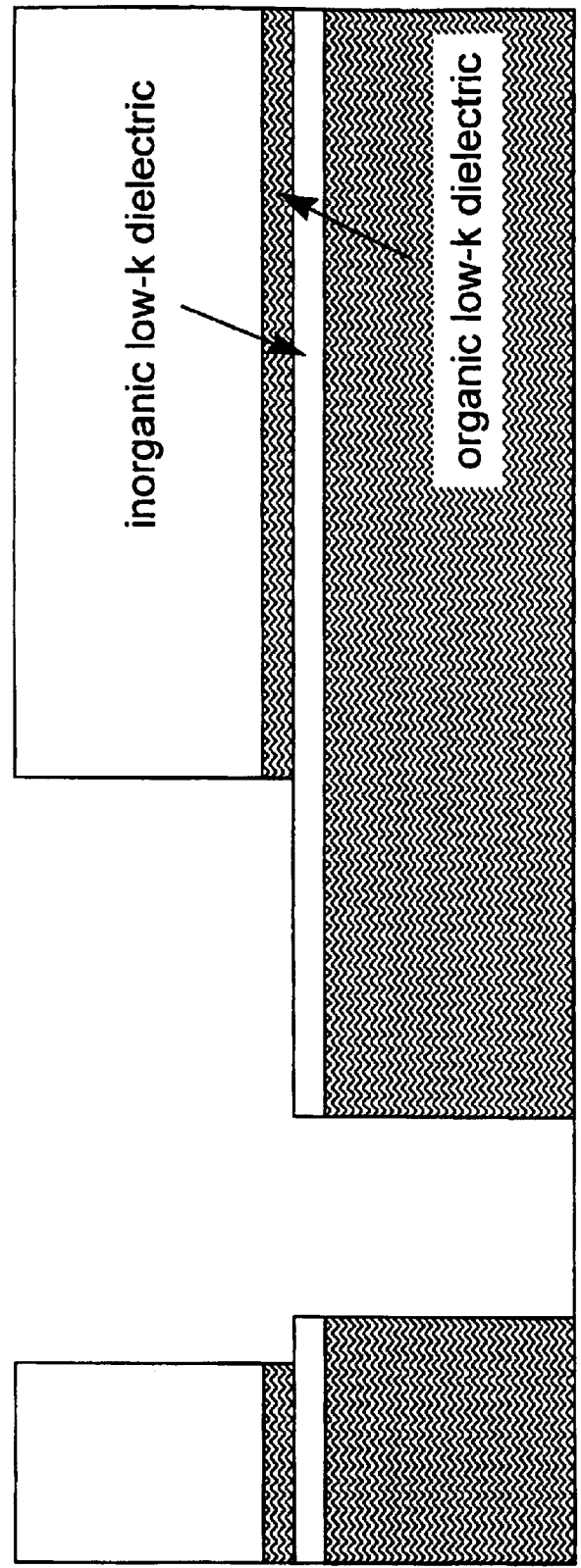
FIG. 17 shows the process after organic low-k dielectric etch
Figure 18:
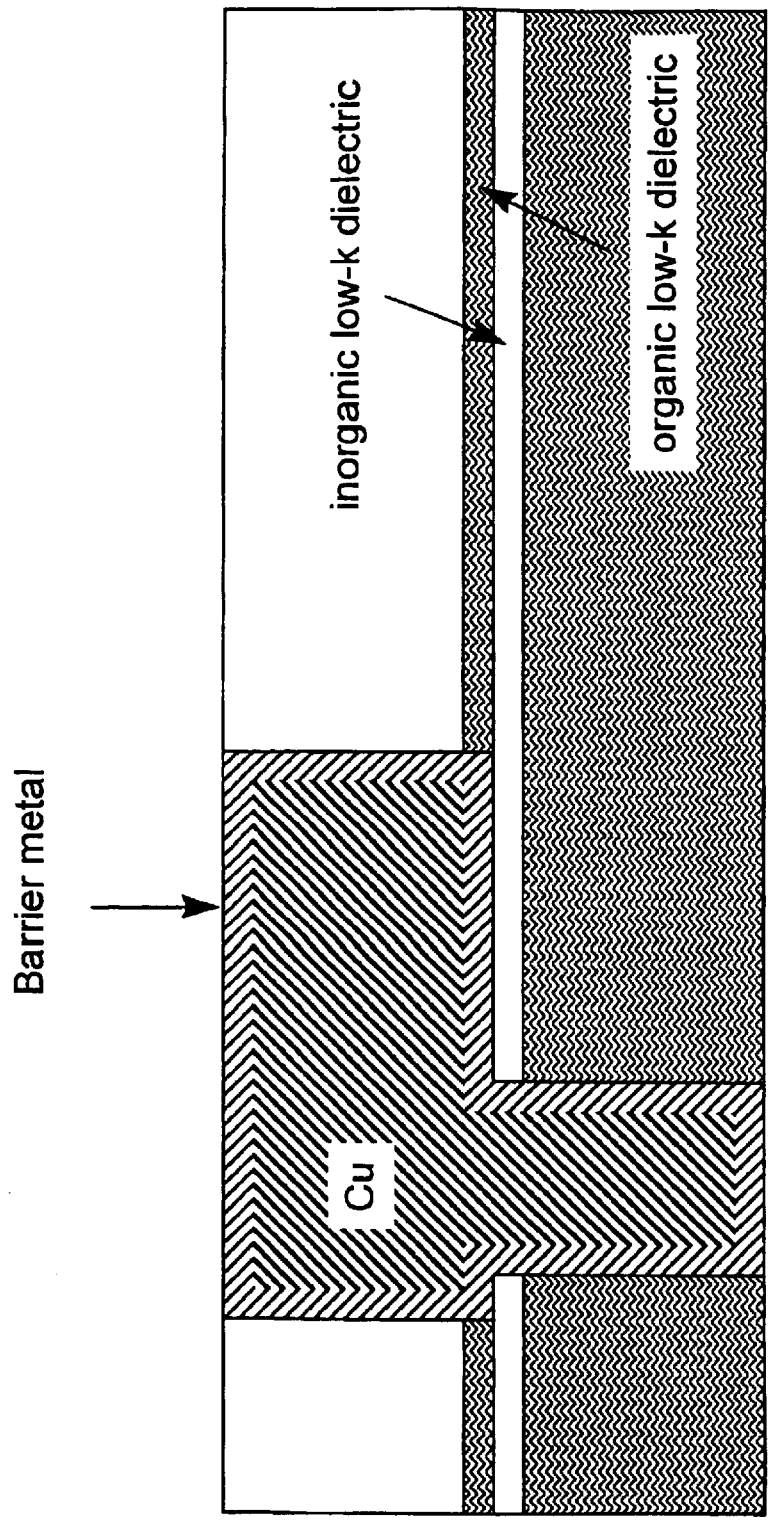
FIG. 18 shows the second embodiment process after Cu interconnect processing.

A second embodiment of the invention is represented by the process steps shown in FIGS. 11–18. The process flow commences after the formation of a first level interconnect or Metal 1 as shown in FIG. 2. The process flow covers from Via 1 level through the second-level of interconnect or Metal 2. However, the same processing steps can be repeated again for upper levels of vias and interconnects. The same substrate, organic dielectric and inorganic dielectric materials may be used as in embodiment 1. FIG. 11 shows the formation process for a second embodiment of the invention. One begins with a substrate, which comprises a pattern of metal lines on the substrate and a dielectric on the substrate between the metal lines as with embodiment 1. An organic low-k dielectric is then deposited onto the substrate followed by deposition of a thin inorganic low-k dielectric and spin-on and baking of a photoresist. The resist is imagewise patterned and removed by development and a portion of the thin inorganic dielectric layer is removed by etching thus defining vias through the thin inorganic dielectric layer. FIG. 12 shows the formation after via mask and resist development and inorganic low-k dielectric etch. FIG. 13 shows the process after resist removal. Some of the exposed part of the organic low-k dielectric will usually be removed to a limited extent. However, such is not critical since the part of organic dielectric which is not covered by a thin layer of inorganic dielectric will be totally removed later. Then a thin organic dielectric etchstop material layer is deposited on the thin inorganic dielectric layer. This also fills the vias in the thin inorganic dielectric layer with the organic dielectric material. Then a metal level inorganic dielectric layer is deposited on the organic dielectric etchstop layer. The metal level inorganic dielectric is then imagewise patterned. This may be done by depositing, baking, exposing and developing a photoresist. FIG. 14 shows the process after organic low-k dielectric deposition, inorganic low-k dielectric deposition, resist spin and bake and metal trench mask and resist development. This inorganic low-k dielectric layer is for metal-level IMD. The portion of the inorganic dielectric layer under the removed part of the photoresist is then etched down to the organic dielectric etchstop material layer to form trenches in the metal level inorganic dielectric layer. The organic low-k dielectric serves as etchstop since it etches significantly slower than the inorganic low-k dielectric. FIG. 15 shows the metal trenches produced at this step after inorganic low-k dielectric etch. The portion of the organic dielectric etchstop material layer underlying the corresponding removed portion of the metal level inorganic dielectric is then removed by etching to form trenches therein. At the same time the organic etchstop material is removed from the vias in the thin inorganic dielectric layer. Some resist is removed at this step. FIG. 16 shows the process after the organic low-k dielectric etch step. Then one removes the portion of the organic via level dielectric layer underlying the thin inorganic dielectric layer thus forming vias through the organic via level dielectric layer down to the metal lines. The inorganic low-k dielectric on top of the organic low-k dielectric serves as mask. Resist is also removed at this step. Steps 12 and 13 can be combined together into a single step. The result is shown in FIG. 17. Thereafter the vias are filled with a metal in the via level organic dielectric layer and the thin inorganic dielectric layer, and trenches in the organic dielectric etchstop layer and metal level inorganic dielectric layer with a metal as shown in FIG. 18. Repetition of the process produces the structure of architecture II as seen in FIG. 2.

Figure 19:
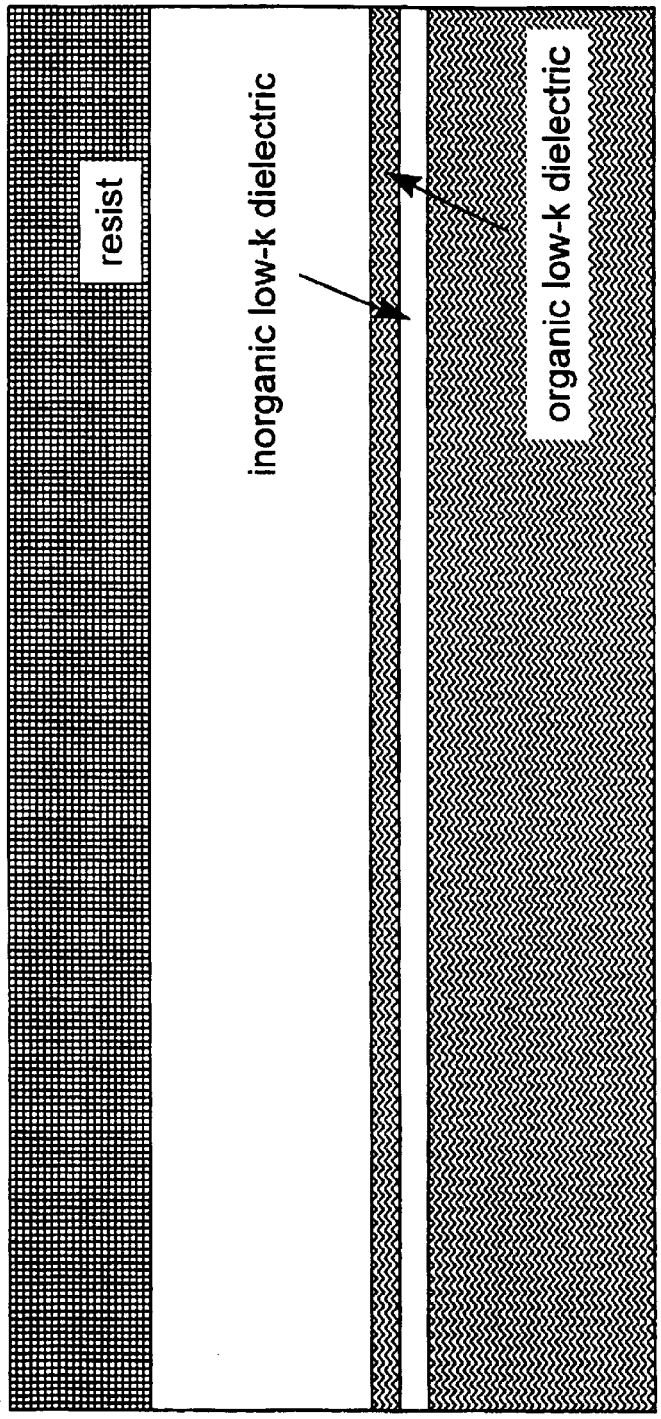
FIG. 19 shows a third embodiment of the invention after organic low-k dielectric deposition, inorganic low-k dielectric deposition, organic low-k dielectric deposition, inorganic low-k dielectric deposition and resist spin and bake.
Figure 20:
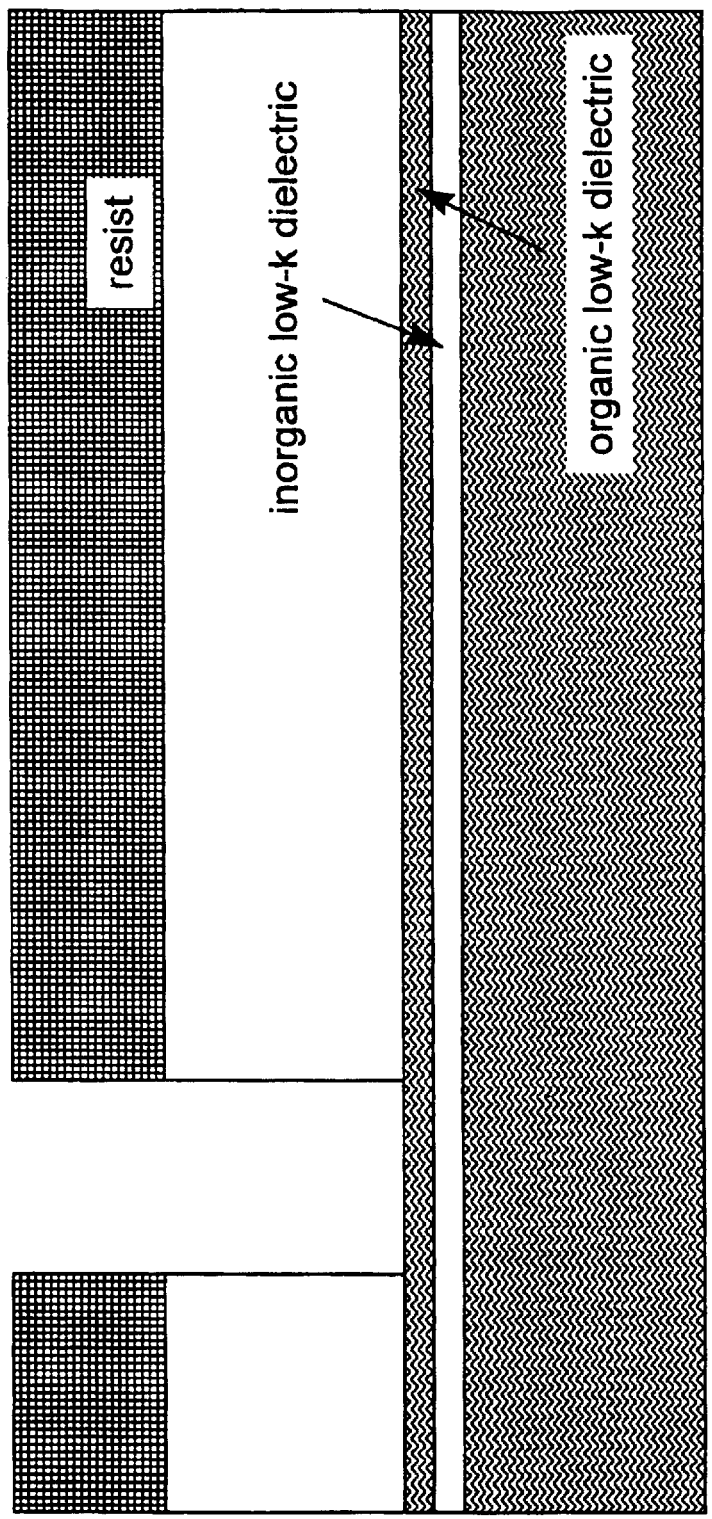
FIG. 20 shows the process after via mask and resist development and inorganic low-k dielectric etch.
Figure 21:
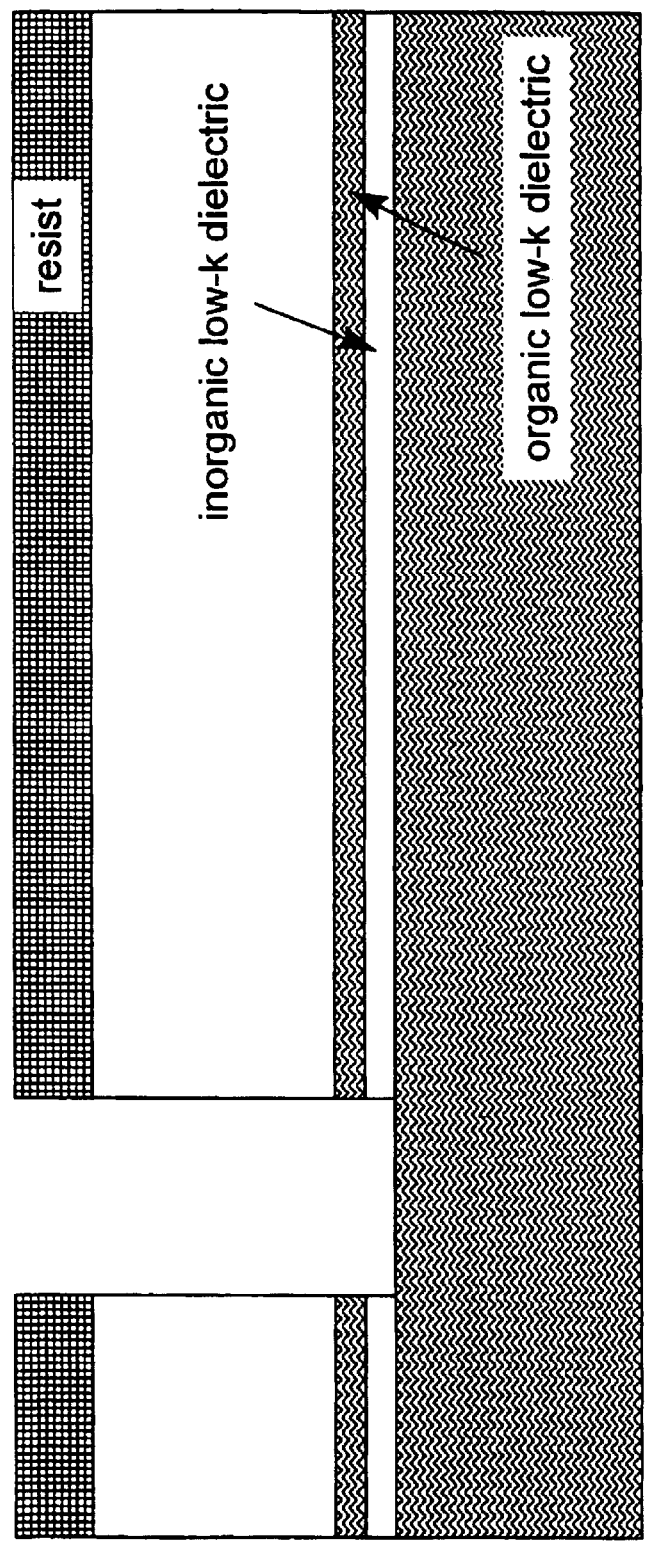
FIG. 21 shows the process result after organic low-k dielectric etch and inorganic low-k dielectric etch.
Figure 22:
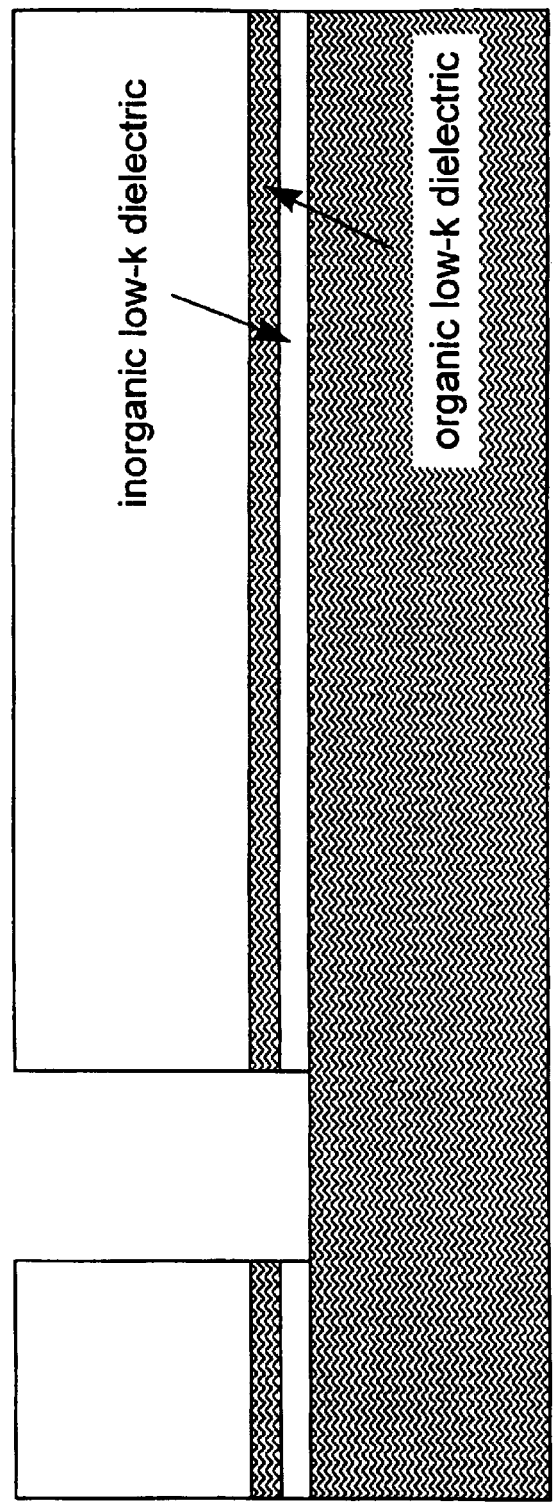
FIG. 22 shows the process result after selective resist removal.
Figure 23:
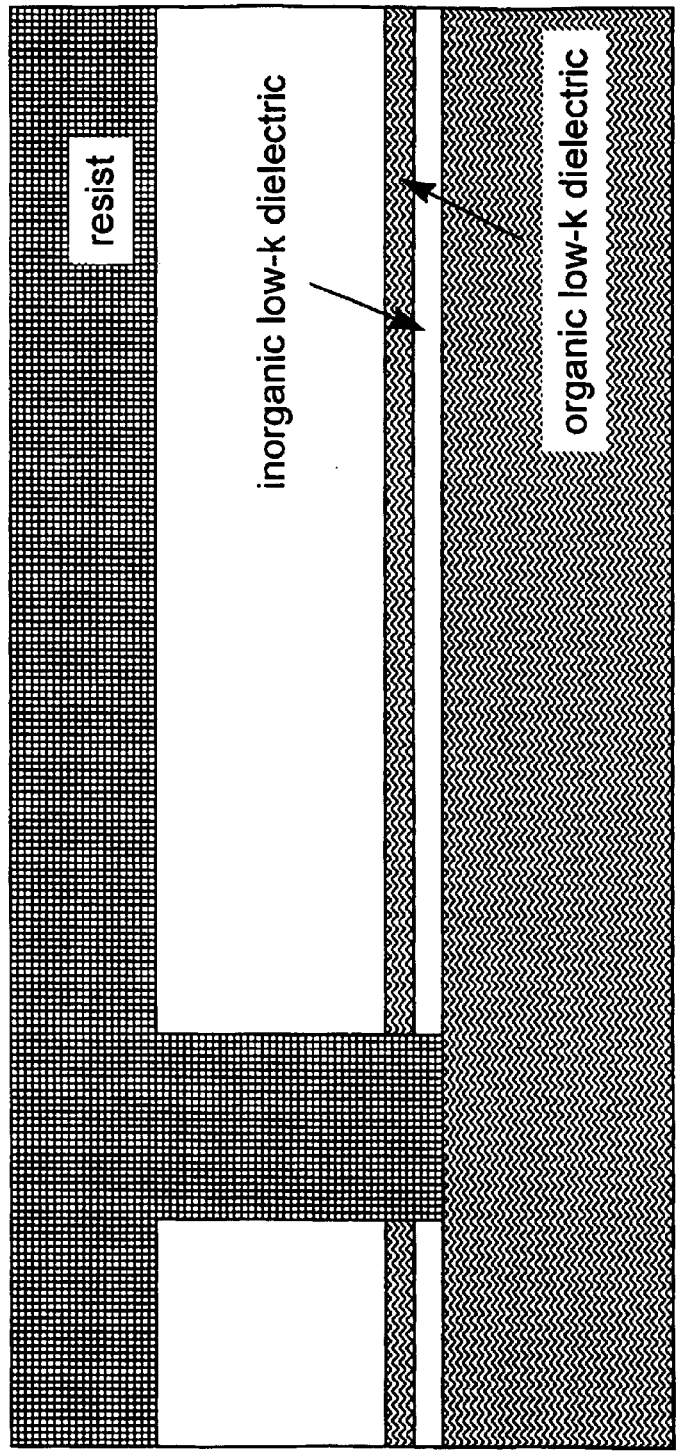
FIG. 23 shows the process result after resist spin and bake.
Figure 24:
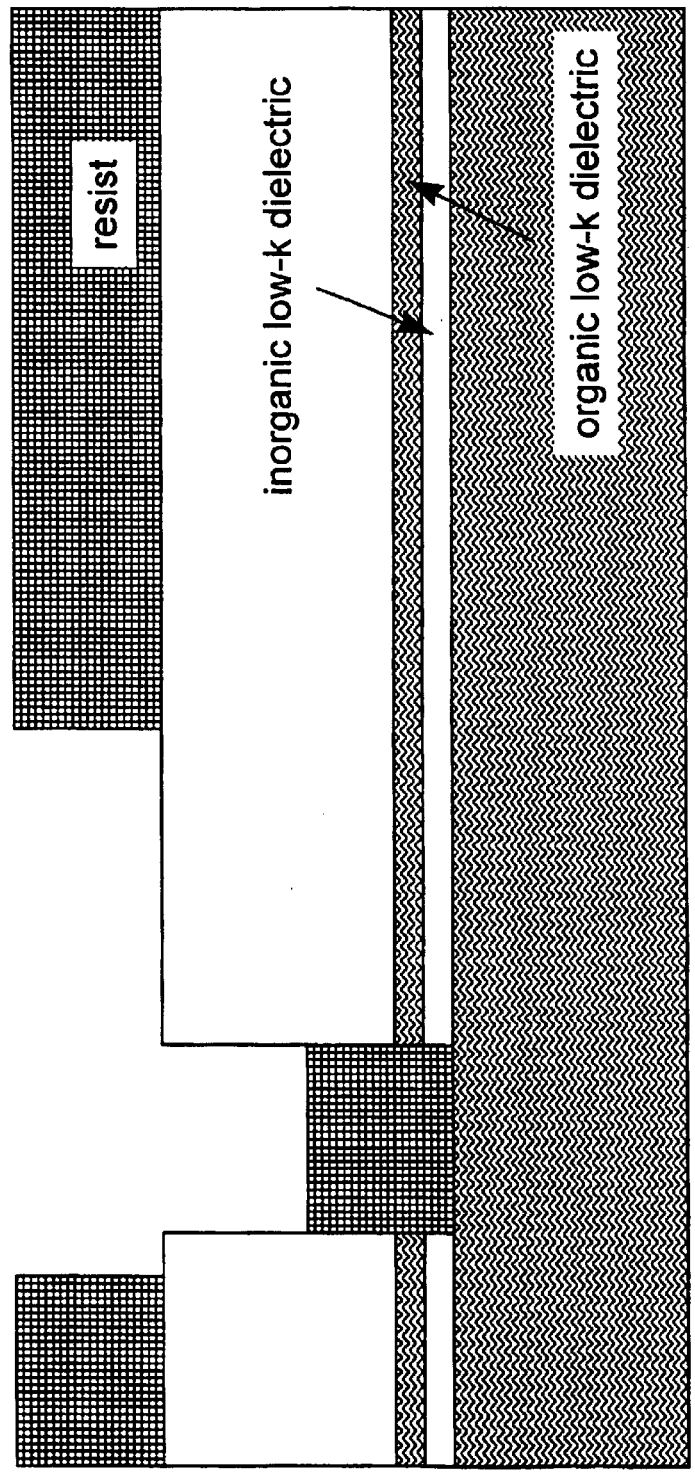
FIG. 24 shows the process result after metal trench mask and resist development.

A third embodiment of the invention is represented by the process steps shown in FIGS. 19–27. The process flow after the formation of the first-level interconnect or Metal 1. The process flow covers from Via 1 level through the second-level of interconnect or Metal 2. However, the same processing steps can be repeated again for upper levels of vias and interconnects. In this embodiment one providing a substrate, which comprises a pattern of metal lines on the substrate and a dielectric on the substrate between the metal lines as with the previous embodiments. An organic via level dielectric layer is deposited on the substrate; a thin inorganic dielectric layer is deposited on the organic via level dielectric and a thin organic dielectric etchstop material layer is deposited on the thin inorganic dielectric layer. The thin organic dielectric etchstop material layer and the thin inorganic low-k dielectric layer together separate the via-level and metal-level IMD's. Then a metal level inorganic dielectric layer is deposited on the organic dielectric etchstop layer. A photoresist is deposited on the metal level inorganic dielectric layer to produce the structure of FIG. 19. The photoresist is imagewise exposed, baked and developed as before. After removing a portion of the metal level inorganic dielectric layer down to the organic dielectric etchstop material layer vias are formed in the metal level inorganic dielectric layer as shown in FIG. 20. After removing the portion of the organic dielectric etchstop material layer underlying the corresponding removed portions of the metal level inorganic dielectric layer vias are formed in the organic dielectric etchstop material layer. After removing the portion of the thin inorganic dielectric layer underlying the corresponding removed portions of the organic dielectric etchstop material layer vias are formed in the thin inorganic dielectric layer. The result is seen in FIG. 21. The resist is then removed to provide the structure of FIG. 22. One then covers the top of the metal level inorganic dielectric layer with a photoresist and fills the vias in the metal level inorganic dielectric layer, the organic dielectric etchstop material layer and the thin inorganic dielectric layer with photoresist as shown in FIG. 23. After imagewise patterning the photoresist through a trench mask, removing a portion of the photoresist from the top of the metal level inorganic dielectric layer, and removing a portion and leaving a portion of the photoresist through a thickness of the metal level inorganic dielectric layer, the structure of FIG. 24 is obtained.

Figure 25:
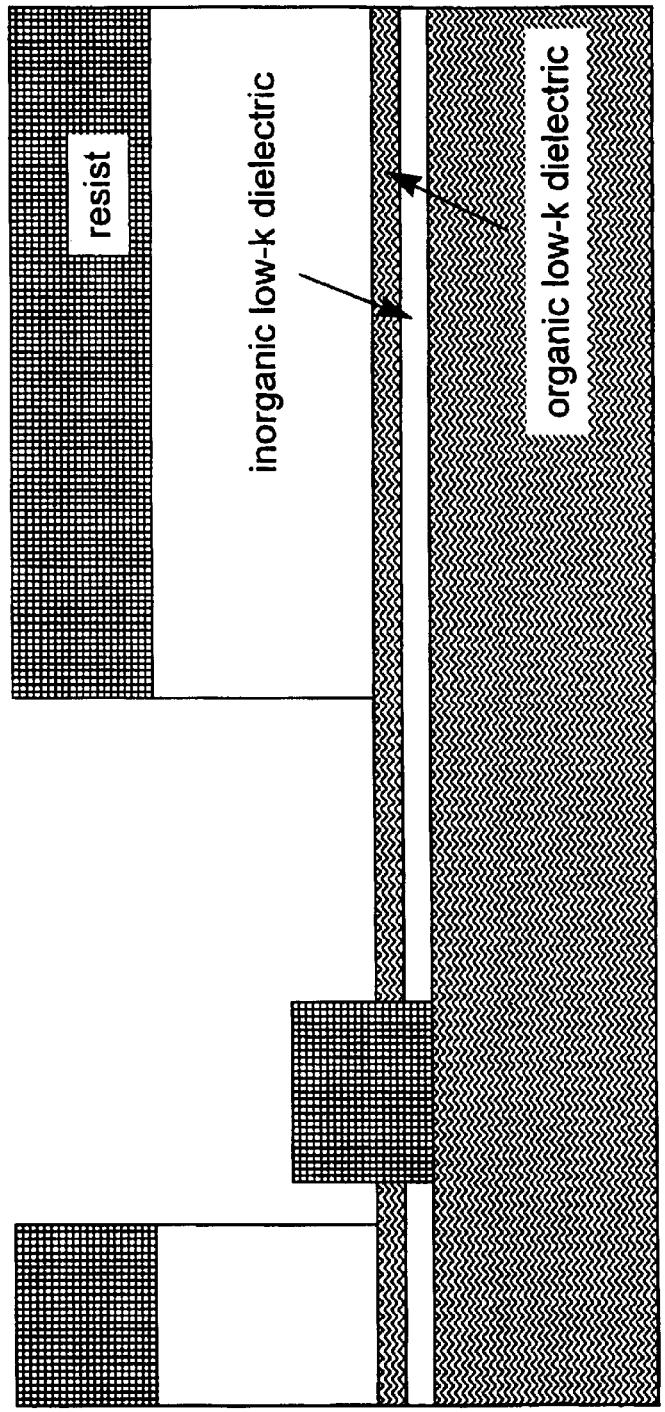
FIG. 25 shows the process result after inorganic low-k dielectric etch.
Figure 26:
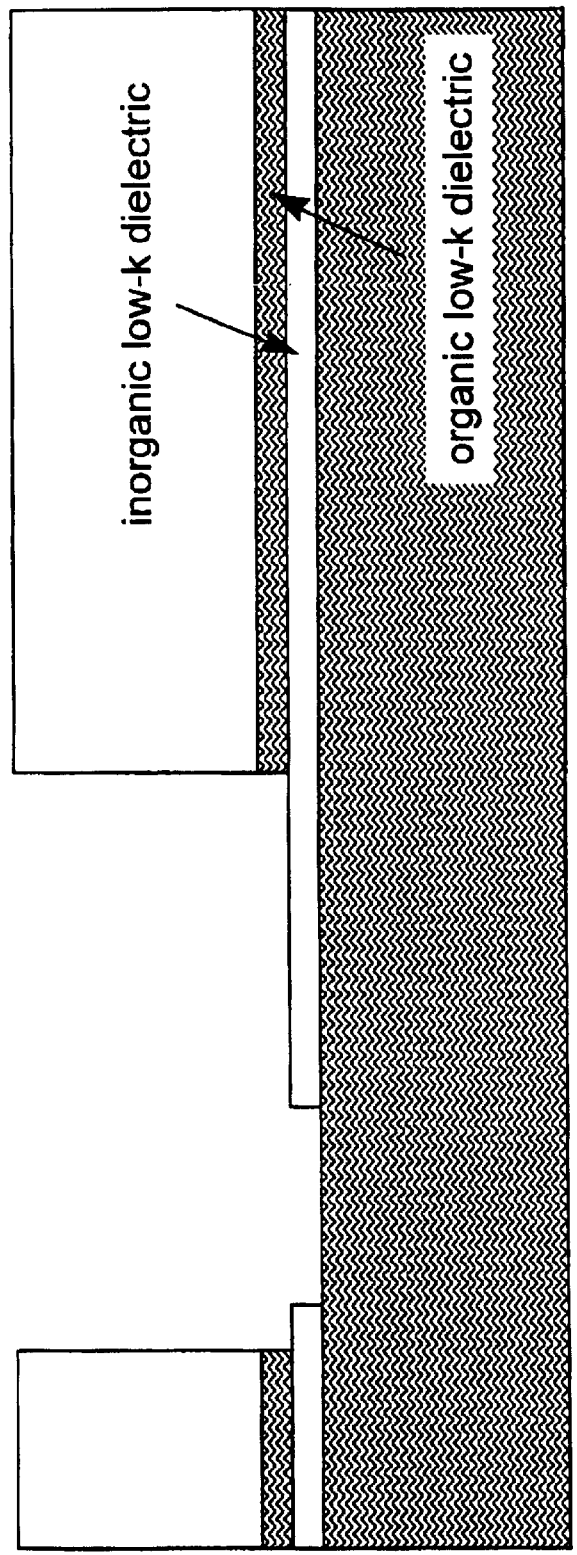
FIG. 26 shows the process result after organic low-k dielectric etch.
Figure 27:
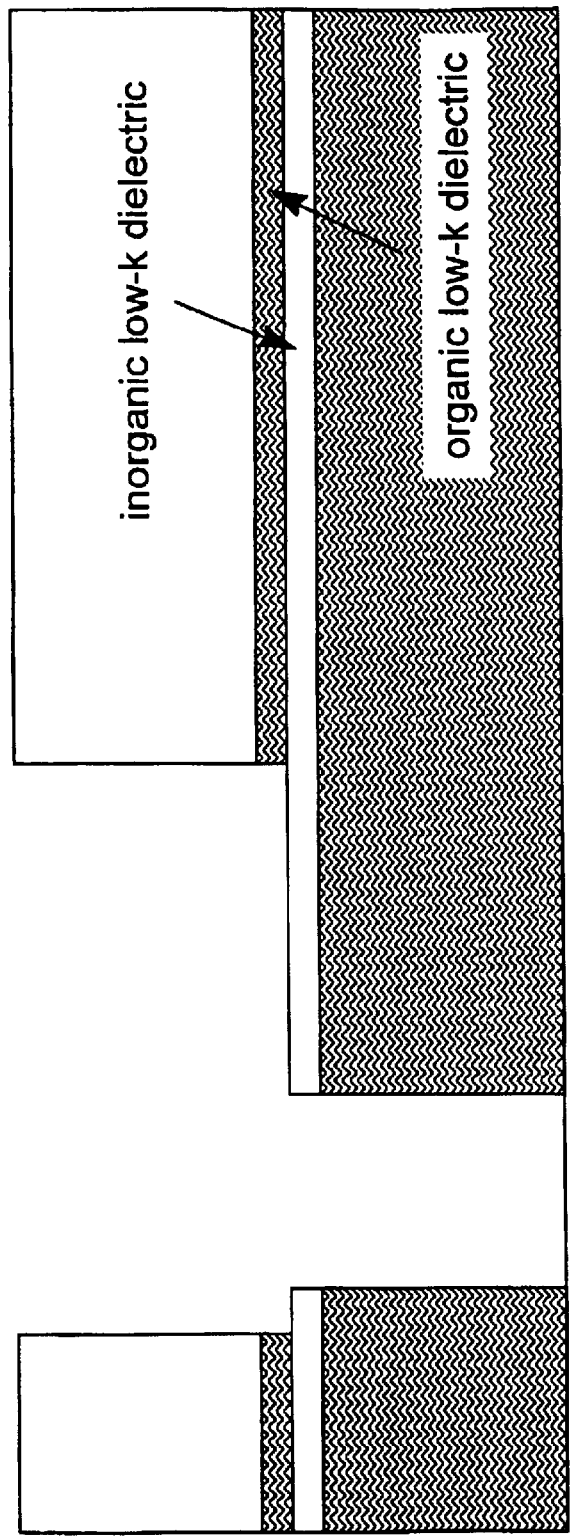
FIG. 27 shows the process result after via inorganic low-k dielectric etch.

After removing part of the metal level inorganic dielectric layer underlying the portions of the photoresist removed from the top of the inorganic dielectric layer trenches are formed in the metal level inorganic dielectric layer as shown in FIG. 25. After removing the balance of the photoresist from the top of the metal level inorganic dielectric layer and from the vias; and removing the portion of the organic dielectric etchstop material layer underlying the trenches until the thin inorganic dielectric layer is reached, the structure of FIG. 26 is obtained. One then removes the portion of the organic via level dielectric layer underlying the vias in the thin inorganic dielectric layer as shown in FIG. 27. This step completes the opening of via holes. After filling the vias in the via level organic dielectric layer and the thin inorganic dielectric layer, and trenches in the organic dielectric etchstop layer and metal level inorganic dielectric layer with a metal the structure of FIG. 18 is obtained. The process may be repeated to obtain architecture II of FIG. 2. The third embodiment differs from the second embodiment in that all dielectric depositions are done sequentially and no masking and plasma etch is done between dielectric depositions. All masking and etches are done sequentially. This may represent a preferred process flow in certain integrated circuit fabrication facilities.

Figure 28:
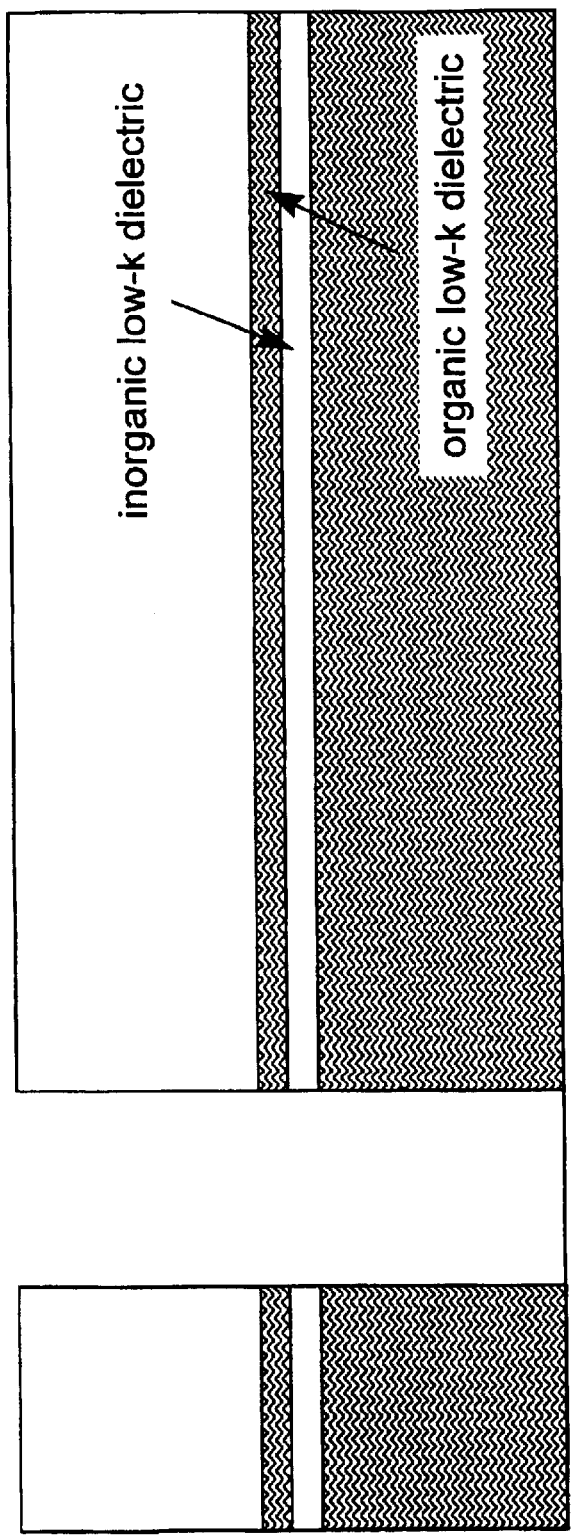
FIG. 28 shows a fourth embodiment of the invention after organic low-k dielectric etch.
Figure 29:
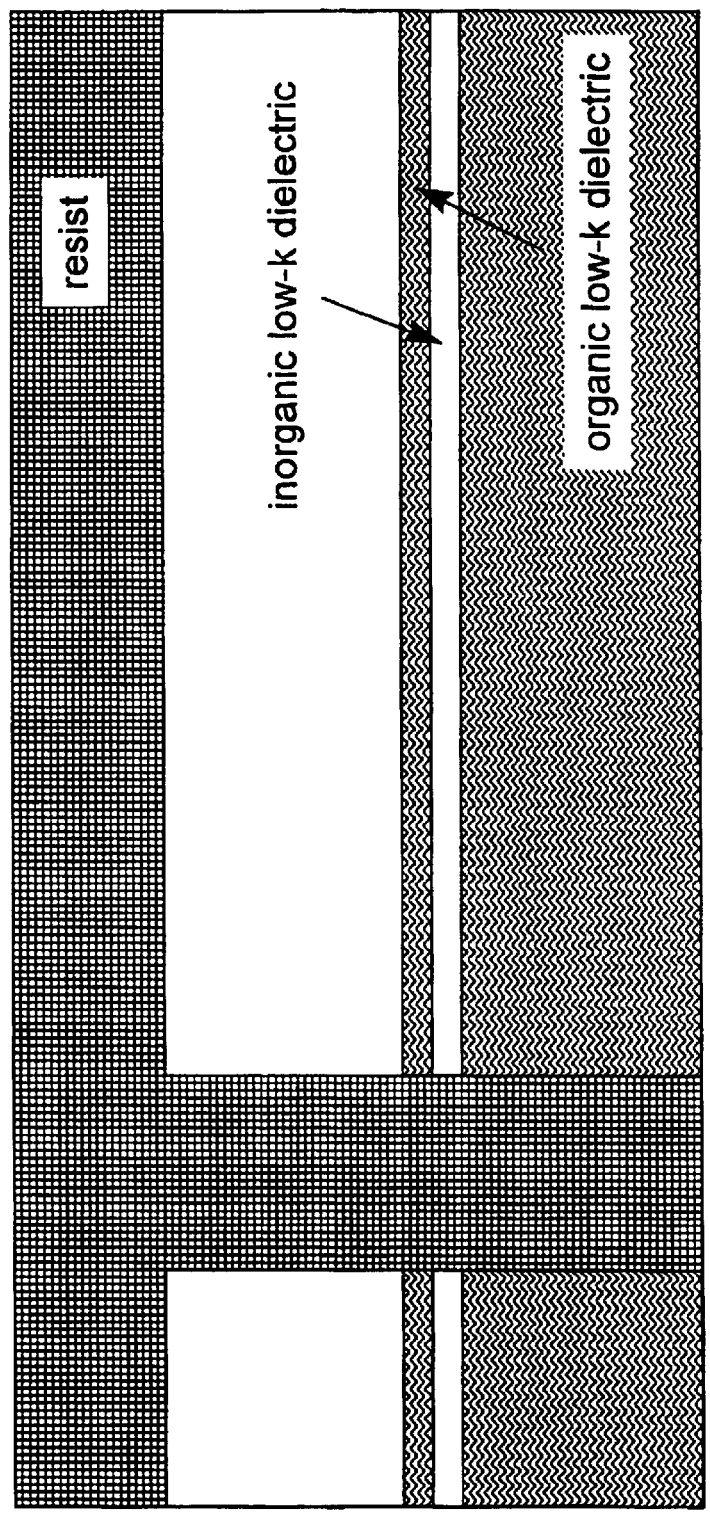
FIG. 29 shows the process result after resist spin and bake.

A fourth embodiment of the invention is represented by the process steps shown in FIGS. 28–32. The process flow commences after the formation of the first-level interconnect or Metal 1. The process flow covers from Via 1 level through the second-level of interconnect or Metal 2. However, the same processing steps can be repeated again for upper levels of vias and interconnects. Steps 1–9 for this fourth embodiment are the same as steps 1–9 of the third embodiment as shown in FIGS. 19–21 as described above. One then removes the portion of the organic via level dielectric layer underlying the corresponding removed portions of the thin inorganic dielectric layer to form vias in the organic via level dielectric layer as shown in FIG. 28. One then covers the top of the metal level inorganic dielectric layer with a photoresist and fills the vias in the metal level inorganic dielectric layer, the organic dielectric etchstop material layer, the thin inorganic dielectric layer and the organic via level dielectric layer with photoresist as shown in FIG. 29.

Figure 30:
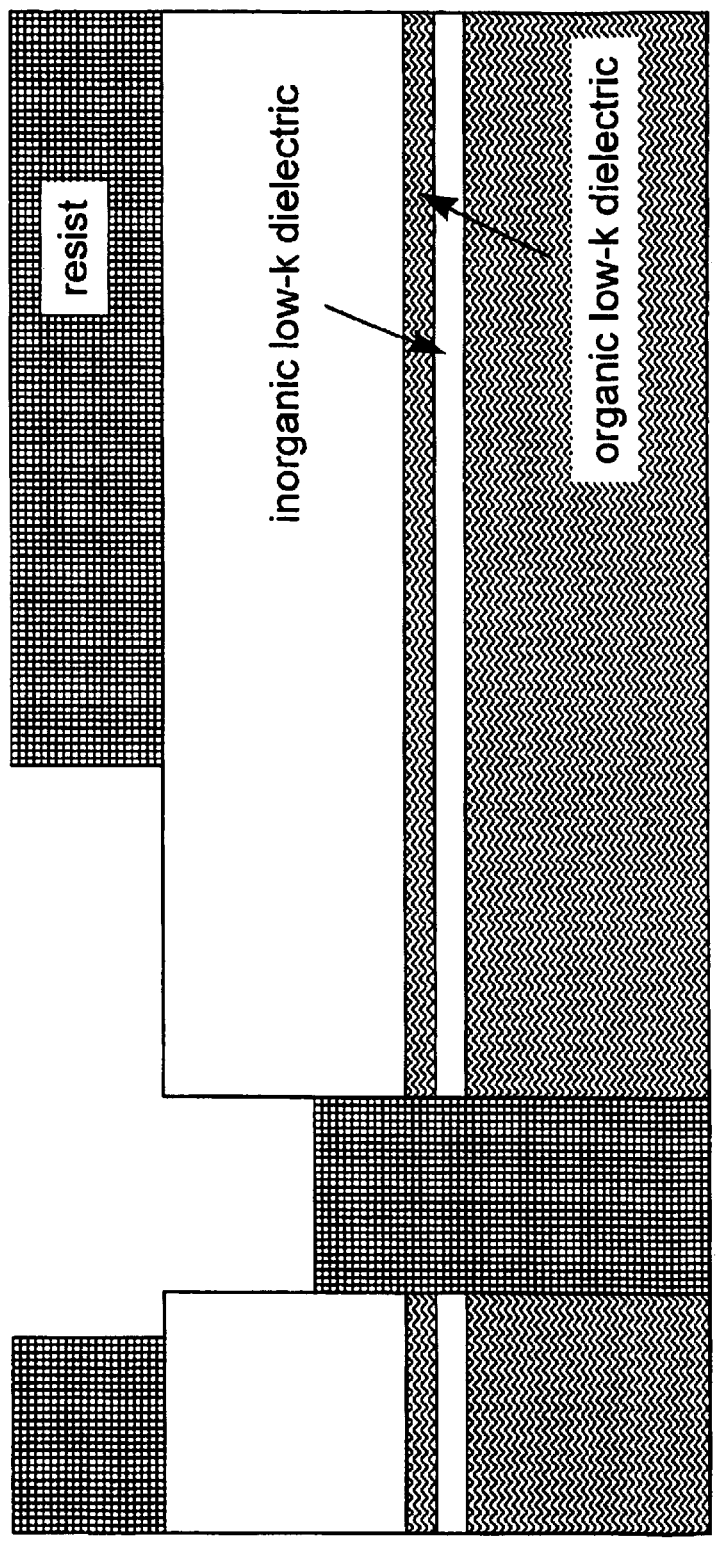
FIG. 30 shows the process result after metal trench mask and resist development.
Figure 31:
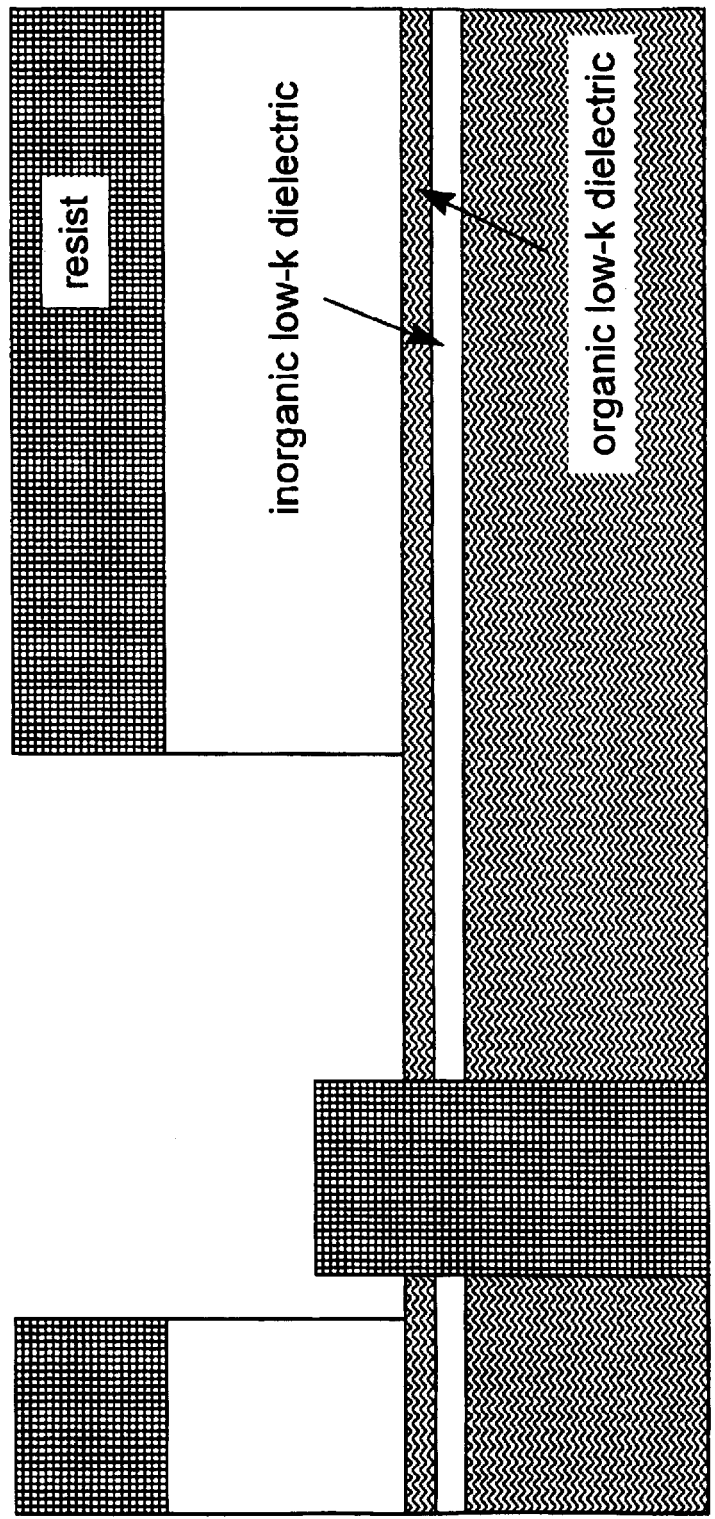
FIG. 31 shows the process result after inorganic low-k dielectric etch.
Figure 32:
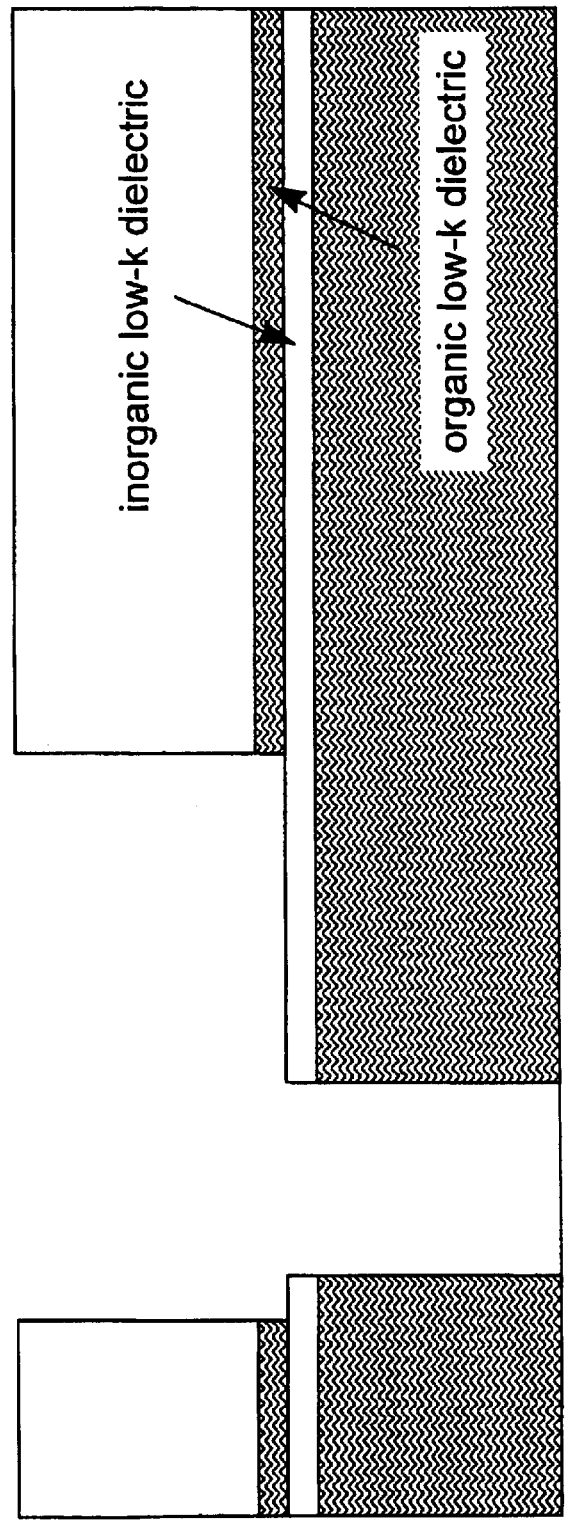
FIG. 32 shows the process result after organic low-k dielectric and resist etch.

After imagewise patterning and removing a portion of the photoresist from the top of the inorganic dielectric layer; and removing a portion and leaving a portion of the photoresist through a thickness of the metal level inorganic dielectric layer the structure of FIG. 30 is obtained. After removing part of the metal level inorganic dielectric layer underlying the portions of the photoresist removed from the top of the inorganic dielectric layer trenches are formed in the metal level inorganic dielectric layer as shown in FIG. 31. Thereafter one removes the balance of the photoresist from the top of the metal level inorganic dielectric layer and from the vias; and removes the portion of the organic dielectric etchstop material layer underlying the trenches until the thin inorganic dielectric layer is reached as shown in FIG. 32. After filling the vias in the via level organic dielectric layer and the thin inorganic dielectric layer, and trenches in the organic dielectric etchstop layer and metal level inorganic dielectric layer with a metal the structure of FIG. 18 is obtained. Upon repetition of these steps, the architecture of FIG. 2 is obtained. Embodiment four is unique in that via patterning is entirely independent of metal trench patterning.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. An integrated circuit structure which comprises a substrate and
    (a) an organic layer on a surface of the substrate which comprises a pattern of metal lines on the substrate and an organic dielectric on the substrate surface between the metal lines, and wherein the organic dielectric comprises a dielectric selected from the group consisting of alkoxysilane polymers, organic siloxanes, hydroorganosiloxanes, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane, methylated siloxane polymers; polymers having the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently $C_1$ to $C_8$ alkyl or $C_6$ to $C_{12}$ aryl;

organic silicon containing polymers having the formulae

[H—SiO$_{1.5}$]$_n$[R—SiO$_{1.5}$]$_m$,

[H$_{0.4}$—SiO$_{1.5-1.8}$]$_n$[R$_{0-1.0}$—SiO$_{1.5-1.8}$]$_m$,

[H$_{0-1.0}$—SiO$_{1.5-2.0}$]$_n$[R—SiO$_{1.5}$]$_m$,

[H—SiO$_{1.5}$]$_x$[R—SiO$_{1.5}$]$_y$[SiO$_2$]$_z$, wherein R is selected from substituted and unsubstituted straight chain and branched alkyl groups, cycloalkyl groups, substituted and unsubstituted aryl groups, and mixtures thereof the sum of n and m, or the sum or x, y and z is from about 8 to about 5000, and m and y are selected such that carbon containing substituents are present in an amount of less than about 40 Mole percent;

organic silicon containing polymers having the formulae:

[HSiO$_{1.5}$]$_n$[RSiO$_{1.5}$]$_m$,

[H$_{0.4-1.0}$SiO$_{1.5-1.8}$]$_n$[R$_{0.4-1.0}$SiO$_{1.5-1.8}$]$_m$,

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 mole percent or greater; and

[HSiO$_{1.5}$]$_x$[RSiO$_{1.5}$]$_y$[SiO$_2$]$_z$;

wherein the sum of x, y and z is from about 8 to about 5000 andy is selected such that the carbon containing substituent is present in an amount of about 40 mole % or greater; and wherein R is selected from substituted and unsubstituted straight chain and branched alkyl groups, cycloalkyl groups, substituted and unsubstituted aryl groups, and mixtures thereof, and mixtures thereof; and (b) an inorganic layer on the organic layer which comprises an inorganic dielectric selected from the group consisting of hydrogensiloxanes, inorganic hydrogensilsesquioxanes and combinations thereof, having metal filled vias therethrough which connect to the metal lines of the organic layer; and wherein the hydrogensiloxanes have the formula $[(HSiO_{1.5})_xO_y]_n$, and the hydrogensilsesquioxanes have the formula $(HSiO_{1.5})_n$, wherein x=about 6 to about 20, y=1 to about 3, and n=1 to about 4,000.

2. The integrated circuit structure of claim 1 which comprises
    (c) an additional organic layer on the inorganic layer which comprises a pattern of additional metal lines on the inorganic layer and an organic dielectric on the inorganic layer between the additional metal lines; and
    (d) an additional inorganic layer on the additional organic layer which comprises an inorganic dielectric having metal filled vias therethrough which connect to the additional metal lines of the additional organic layer.

3. The integrated circut structure of claim 2 which comprises one or more further alternating organic layers (c) and inorganic layers (d) on the additional organic layer (c) and inorganic layer (d).

4. The integrated circuit structure of claim 3 further comprising an organic dielectric layer on each one or more alternating inorganic layer (d) between the vias and under the additional metal lines of the alternating organic layer; and an inorganic dielectric on each one or more organic dielectric layer between the additional metal lines of the additional organic layer.

5. The integrated circuit structure of claim 2 further comprising an organic dielectric layer on the inorganic layer between the vias and under the additional metal lines of the additional organic layer; and an inorganic dielectric on the organic dielectric layer between the additional metal lines of the additional organic layer.

6. The integrated circuit structure of claim 1 wherein the metal lines and vias have a barrier metal on one or more edges thereof.

7. A dielectric coated substrate which comprises:
(a) a first dielectric composition film on a surface of a substrate; and
(b) a second dielectric composition film on the first dielectric composition film; wherein the first dielectric composition and the second dielectric composition have substantially different etch resistance; wherein either the first dielectric composition film is organic and the second dielectric composition film is inorganic; or the first dielectric composition film is inorganic and the second dielectric composition film is organic; wherein the organic dielectric comprises a dielectric selected from the group consisting of alkoxysilane polymers, organic siloxanes, hydroorganosiloxanes, hydrogenrnethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane, methylated siloxane polymers; polymers having the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000. and each R is independently $C_1$ to $C_8$ alkyl or $C_6$ to $C_{12}$ aryl;
organic silicon containing polymers having the formulae

[H—SiO$_{1.5}$]$_n$[R—SiO$_{1.5}$]$_m$,

[H$_{0.4}$—SiO$_{1.5-1.8}$]$_n$[R$_{0.4-1.0}$—SiO$_{1.5-1.8}$]$_m$,

[H$_{0-1.0}$—SiO$_{1.5-2.0}$]$_n$[R—SiO$_{1.5}$]$_m$,

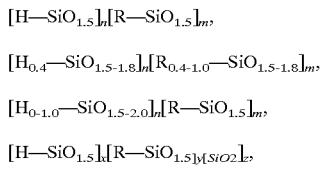

wherein R is selected from substituted and unsubstituted straight chain and branched alkyl groups, cycloalkyl groups, substituted and unsubstintted aryl groups, and mixtures thereof; the sum of n and m, or the sum or x, y and z is from about 8 to about 5000, and m and y are selected such that carbon containing substituents are present in an amount of less than about 40 Mole percent;
organic silicon containing polymers having the formulae:

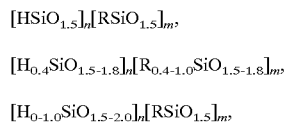

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 mole percent or greater; and

wherein the sum of x, y and z is from about 8 to about 5000 and y is selected such that the carbon containing substituent is present in an amount of about 40 mole % or greater; and wherein R is selected from substituted and unsubstituted straight chain and branched alkyl groups, cycloalkyl groups, substituted and unsubstituted aryl groups, and mixtures thereof, and mixtures thereof; and
wherein the inorganic dielectric composition film comprises an inorganic dielectric selected from the group consisting of hydrogensiloxanes, inorganic hydrogensilsesquioxanes and combinations thereof; and wherein the hydrogensiloxanes have the formula $[(HSiO_{1.5})_xO_y]_n$, and the hydrogensilsesquioxanes have the formula $(HSiO_{1.5})_n$, wherein x=about 6 to about 20. y=1 to about 3, and n=1 to about 4,000.

8. The dielectric coated substrate of claim 7 wherein the first dielectric composition film is organic and the second dielectric composition film is inorganic.

9. The dielectric coated substrate of claim 7 wherein the first dielectric composition film is inorganic and the second dielectric composition turn is organic.

* * * * *